US012046682B2

(12) United States Patent
Jang et al.

(10) Patent No.: US 12,046,682 B2
(45) Date of Patent: Jul. 23, 2024

(54) INTEGRATED CIRCUIT DEVICES

(71) Applicant: Samsung Electronics Co., Ltd., Suwon-si (KR)

(72) Inventors: Ingyu Jang, Seoul (KR); Jinbum Kim, Seoul (KR); Dahye Kim, Seoul (KR); Sujin Jung, Hwaseong-si (KR); Dongsuk Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 401 days.

(21) Appl. No.: 17/689,322

(22) Filed: Mar. 8, 2022

(65) Prior Publication Data

US 2023/0051750 A1 Feb. 16, 2023

(30) Foreign Application Priority Data

Aug. 10, 2021 (KR) .................. 10-2021-0105483

(51) Int. Cl.
| | |
|---|---|
| H01L 29/78 | (2006.01) |
| H01L 21/02 | (2006.01) |
| H01L 21/764 | (2006.01) |
| H01L 21/8234 | (2006.01) |
| H01L 27/088 | (2006.01) |
| H01L 29/06 | (2006.01) |
| H01L 29/423 | (2006.01) |
| H01L 29/66 | (2006.01) |
| H01L 29/786 | (2006.01) |

(52) U.S. Cl.
CPC .... *H01L 29/78696* (2013.01); *H01L 21/0259* (2013.01); *H01L 21/764* (2013.01); *H01L 21/823412* (2013.01); *H01L 21/823418* (2013.01); *H01L 21/823431* (2013.01); *H01L 21/823481* (2013.01); *H01L 27/0886* (2013.01); *H01L 29/0649* (2013.01); *H01L 29/0665* (2013.01); *H01L 29/42392* (2013.01); *H01L 29/66545* (2013.01); *H01L 29/66742* (2013.01); *H01L 29/78618* (2013.01)

(58) Field of Classification Search
None
See application file for complete search history.

(56) References Cited

U.S. PATENT DOCUMENTS

| | | |
|---|---|---|
| 8,987,794 B2 | 3/2015 | Rachmady et al. |
| 10,243,040 B1 | 3/2019 | Park et al. |
| 10,431,696 B2 | 10/2019 | Tsai et al. |
| 10,522,636 B2 | 12/2019 | Yeung et al. |
| 10,522,694 B2 | 12/2019 | Chen et al. |

(Continued)

*Primary Examiner* — Bilkis Jahan
(74) *Attorney, Agent, or Firm* — Myers Bigel, P.A.

(57) ABSTRACT

An integrated circuit (IC) device includes a fin-type active region on a substrate. A mesa-type channel region protrudes from the fin-type active region in a vertical direction. The mesa-type channel region is integrally connected with the fin-type active region. A gate line substantially surrounds a mesa-type channel region on the fin-type active region. A gate dielectric film is between the mesa-type channel region and the gate line. The mesa-type channel region includes: a plurality of round convex portions, which are convex toward the gate line; a concavo-convex sidewall, which includes a portion of each of the plurality of round convex portions and faces the gate line; and at least one void, which is inside the mesa-type channel region.

20 Claims, 29 Drawing Sheets

(56) References Cited

U.S. PATENT DOCUMENTS

| | | | |
|---|---|---|---|
| 10,535,780 B2 * | 1/2020 | Van Dal | H01L 29/41725 |
| 10,672,742 B2 | 6/2020 | Wu et al. | |
| 10,693,008 B2 | 6/2020 | Mukherjee et al. | |
| 10,868,114 B2 | 12/2020 | Chiang et al. | |
| 2018/0175035 A1 * | 6/2018 | Yang | H01L 29/66742 |
| 2021/0305388 A1 * | 9/2021 | Lilak | H01L 21/823431 |

* cited by examiner

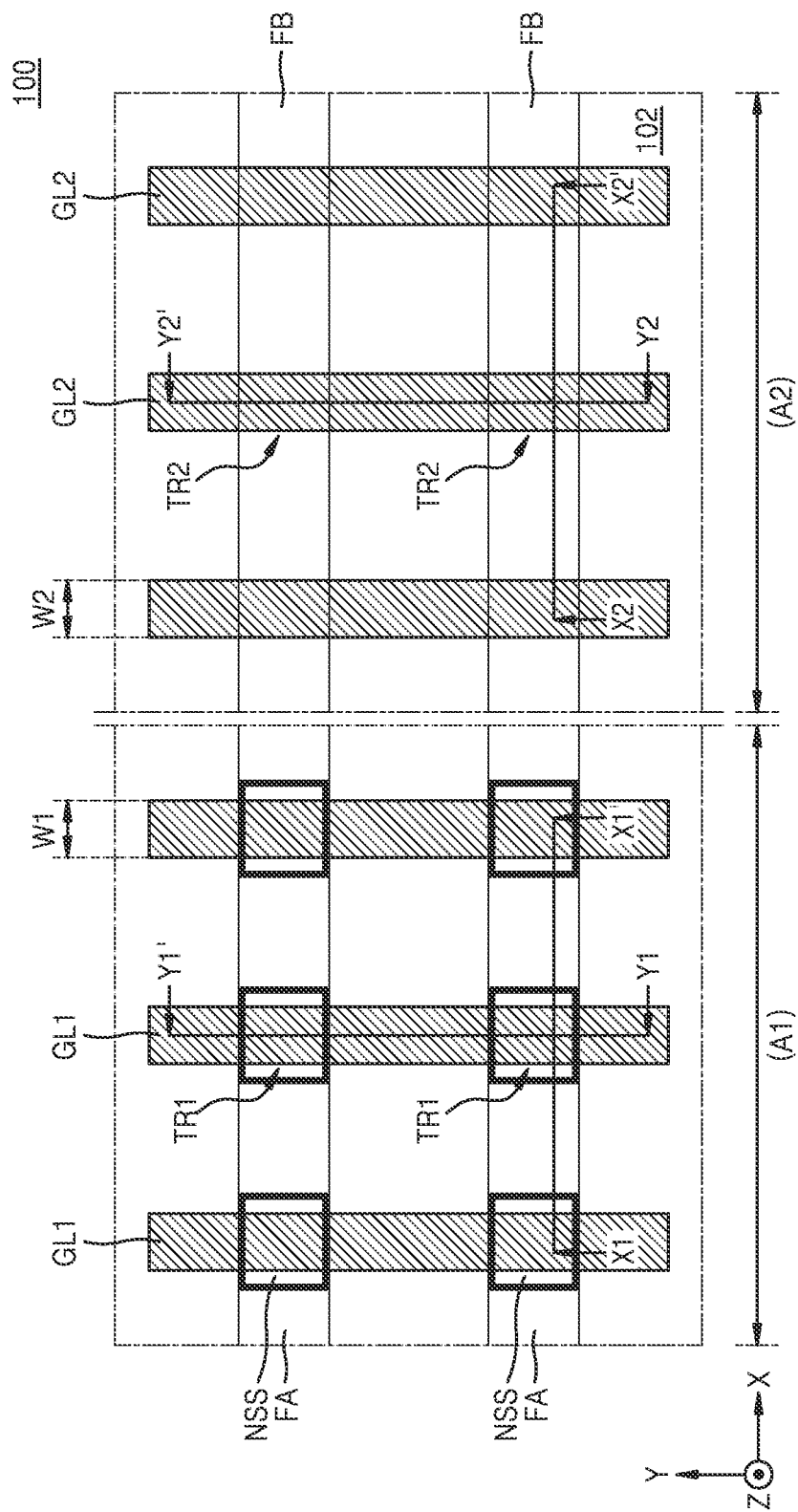

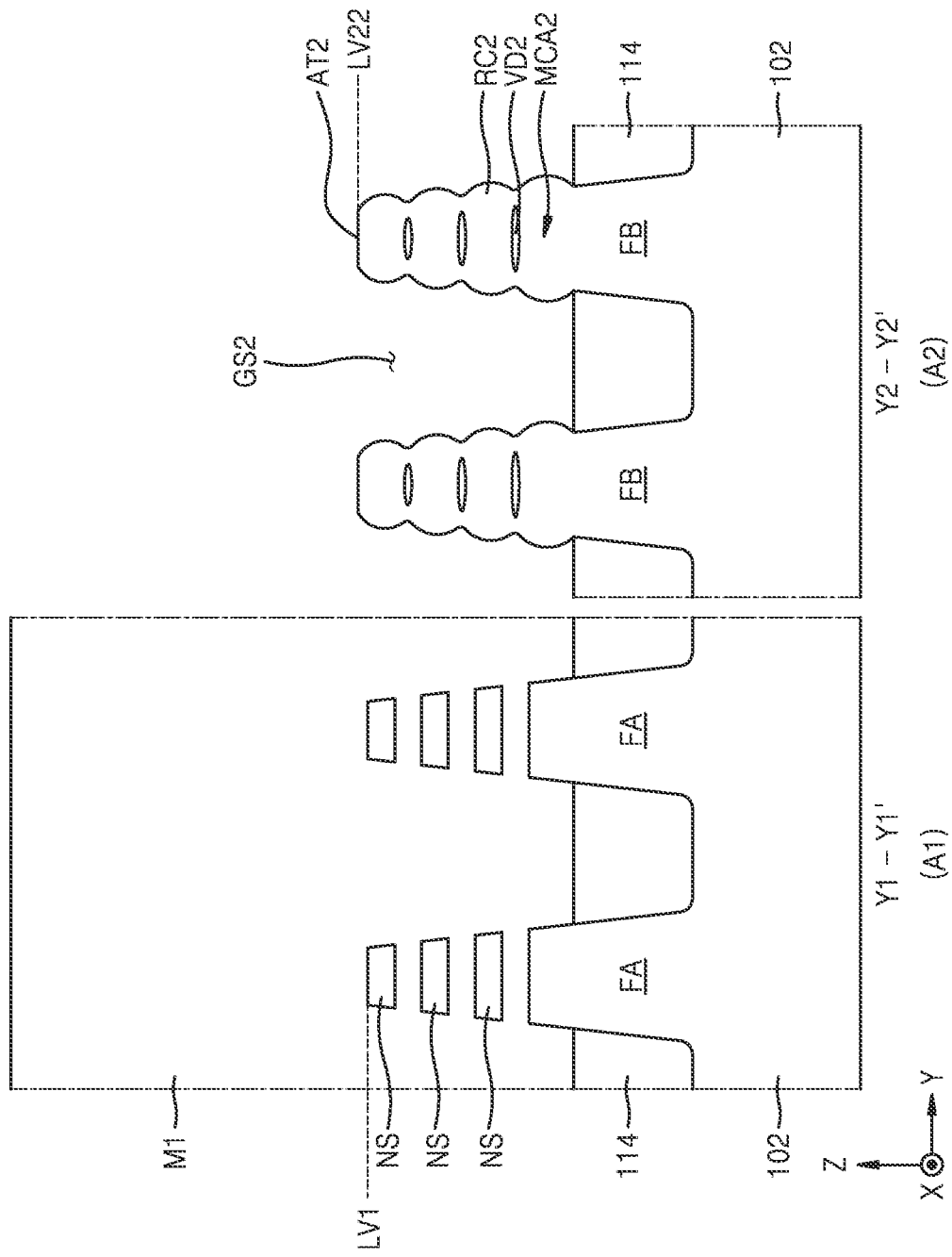

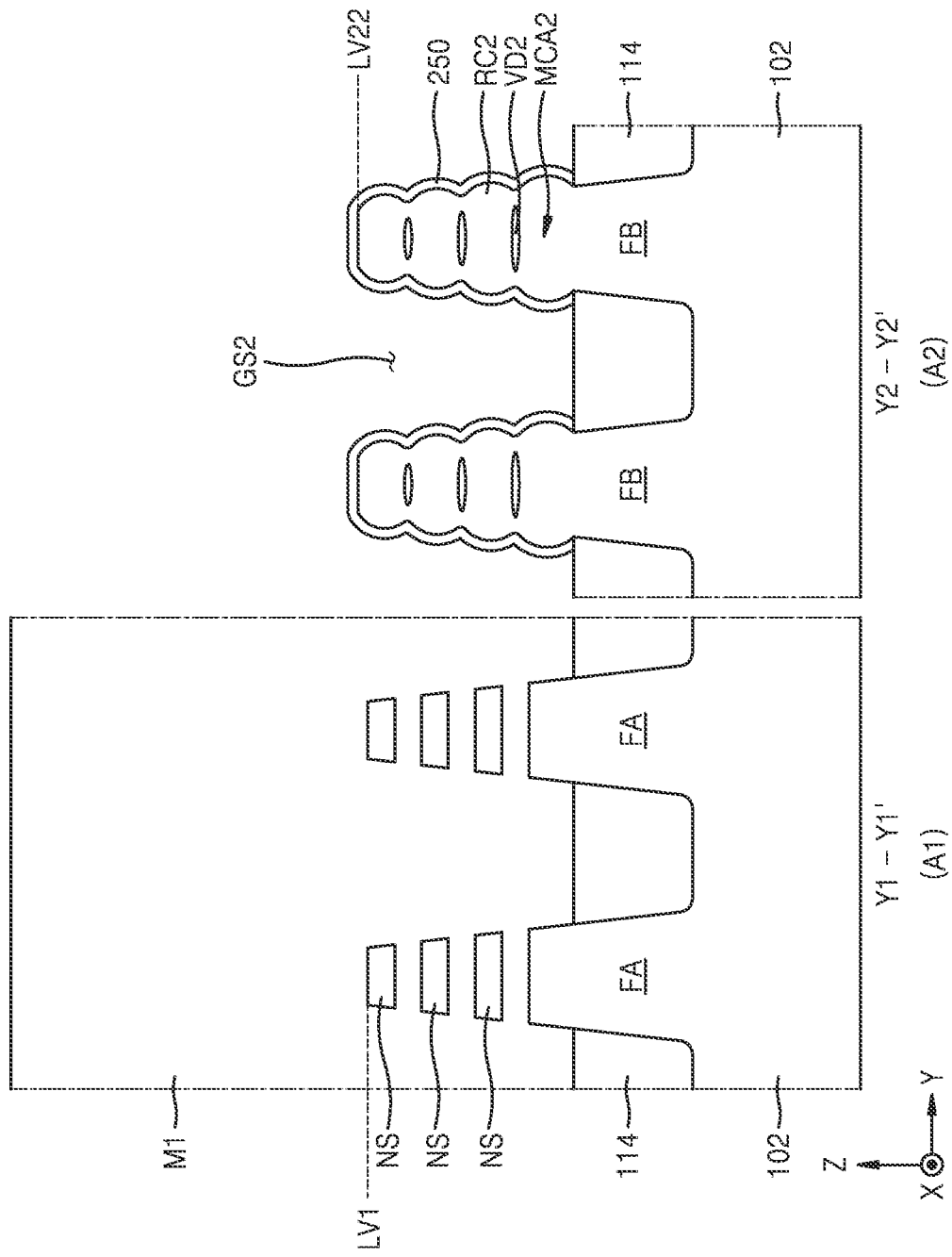

INTEGRATED CIRCUIT DEVICES

CROSS-REFERENCE TO RELATED APPLICATION

This application is based on and claims priority under 35 U.S.C. § 119 to Korean Patent Application No. 10-2021-0105483, filed on Aug. 10, 2021, in the Korean Intellectual Property Office, and the disclosure of the above-identified application is incorporated by reference herein in its entirety.

TECHNICAL FIELD

The present disclosure relates to integrated circuit (IC) devices, and more particularly, to IC devices including at least one field-effect transistor (FET).

Recently, along with the downscaling of IC devices that has rapidly progressed, it has become increasingly desirable that IC devices obtain a fast operation speed and also operational accuracy. In addition, as the integration density of the IC devices increases and the sizes of the IC devices are reduced, development of devices capable of improving reliability by adopting a structure according to operating voltages of devices may become increasingly important.

SUMMARY

The present disclosure provides integrated circuit (IC) devices, which may have a reduced area and may exhibit improved reliability via adoption of a different structures according to operating voltages of devices.

According to some aspects of the inventive concepts, an IC device may be provided, with the IC device including a fin-type active region on a substrate. A mesa-type channel region may protrude from the fin-type active region in a vertical direction. The mesa-type channel region may be integrally connected to the fin-type active region. A gate line may substantially surround a mesa-type channel region on the fin-type active region. A gate dielectric film may be between the mesa-type channel region and the gate line. The mesa-type channel region may include: a plurality of round convex portions, which may be convex toward the gate line; a concavo-convex sidewall, which may include a portion of each of the plurality of round convex portions and may face the gate line; and at least one void, which may be inside the mesa-type channel region.

According to some aspects of the inventive concepts, an IC device may be provided, with the IC device including a substrate including a first device region and a second device region, which are spaced apart from each other in a lateral direction. A first fin-type active region may be in the first device region. A nanosheet stack may be on the first fin-type active region in the first device region. The nanosheet stack may include at least one nanosheet. A first gate line may be on the first fin-type active region in the first device region. The first gate line may surround the at least one nanosheet. A second fin-type active region may be in the second device region. A mesa-type channel region may protrude from the second fin-type active region in a vertical direction in the second device region. The mesa-type channel region may be integrally connected to the second fin-type active region. A second gate line may be on the second fin-type active region in the second device region. The second gate line may substantially surround the mesa-type channel region. The mesa-type channel region may include: a plurality of round convex portions, which may be convex toward the second gate line; a concavo-convex sidewall, which may include a portion of each of the plurality of round convex portions and may face the second gate line; and at least one void, which may be inside the mesa-type channel region.

According to some aspects of the inventive concepts, an IC device is provided, with the IC device including a substrate including a first device region and a second device region, which are spaced apart from each other. A first fin-type active region may be in the first device region. A plurality of nanosheets may be on the first fin-type active region in the first device region. A first gate line may be on the first fin-type active region in the first device region. The first gate line may substantially surround the plurality of nanosheets. A second fin-type active region may be in the second device region. A mesa-type channel region may protrude from the second fin-type active region in a vertical direction in the second device region. The mesa-type channel region may be integrally connected to the second fin-type active region. A second gate line may be on the second fin-type active region in the second device region. The second gate line may substantially surround the mesa-type channel region. The mesa-type channel region may include: a plurality of round convex portions, which are convex toward the second gate line; a concavo-convex sidewall, which may include a portion of each of the plurality of round convex portions and may face the second gate line; and a plurality of voids, which are colinear in the vertical direction inside the mesa-type channel region. The plurality of voids may have decreasing sizes with increasing distance thereof from the substrate.

BRIEF DESCRIPTION OF THE DRAWINGS

Aspects of the inventive concepts disclosed herein will be more clearly understood from the following detailed description of examples of embodiments taken in conjunction with the accompanying drawings in which:

FIG. 1 is a layout diagram of an integrated circuit (IC) device, according to some embodiments;

FIGS. 6A to 16B are diagrams of a process sequence of a method of manufacturing an IC device, according to some embodiments, wherein FIGS. 6A, 7A, 8 to 11, 12A, 13A, 14A, 15A, and 16A are each cross-sectional views of a configuration corresponding to cross-sections taken along lines X1-X1' and X2-X2' of FIG. 4, according to the process sequence, and FIGS. 6B, 7B, 12B, 13B, 14B, 15B, and 16B are each cross-sectional views of a configuration corresponding to cross-sections taken along lines Y1-Y1' and Y2-Y2' of FIG. 4, according to the process sequence.

DETAILED DESCRIPTION

Figure 2A:
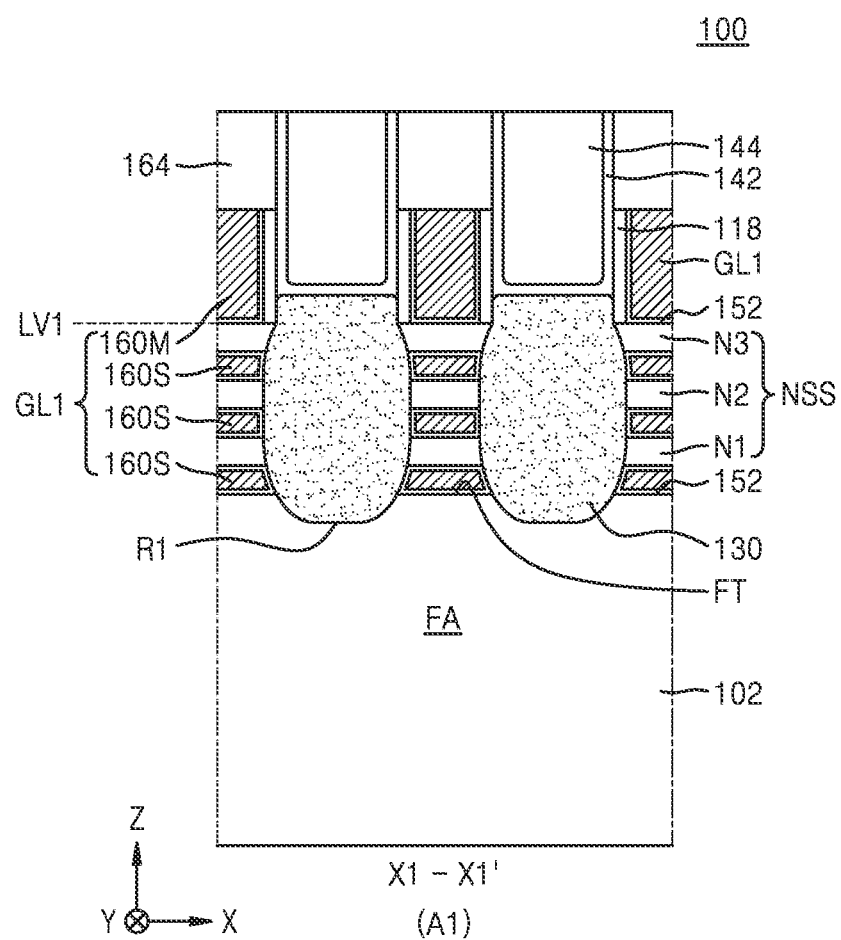
FIG. 2A is a cross-sectional view taken along line X1-X1' of FIG. 1.

Hereinafter, some examples of embodiments will be described in detail with reference to the accompanying drawings. The same reference numerals are used to denote the same elements in the drawings, and repeated descriptions thereof will be omitted.

Figure 2B:
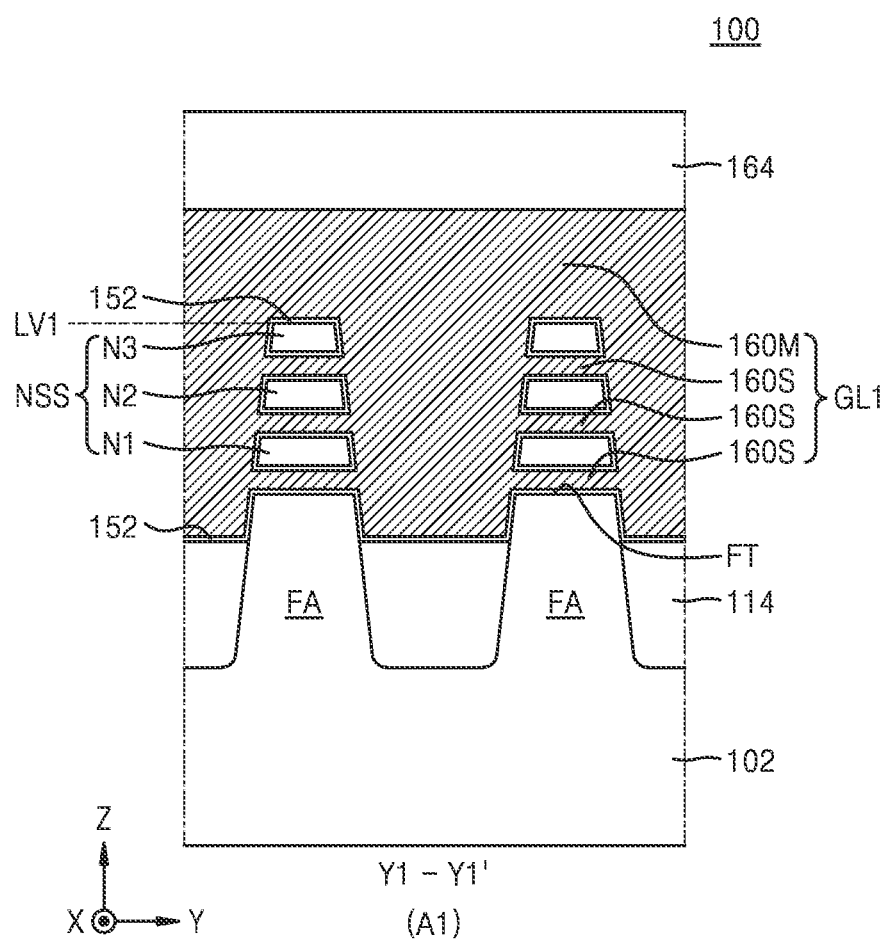
FIG. 2B is a cross-sectional view taken along line Y1-Y1' of FIG. 1.
Figure 2C:
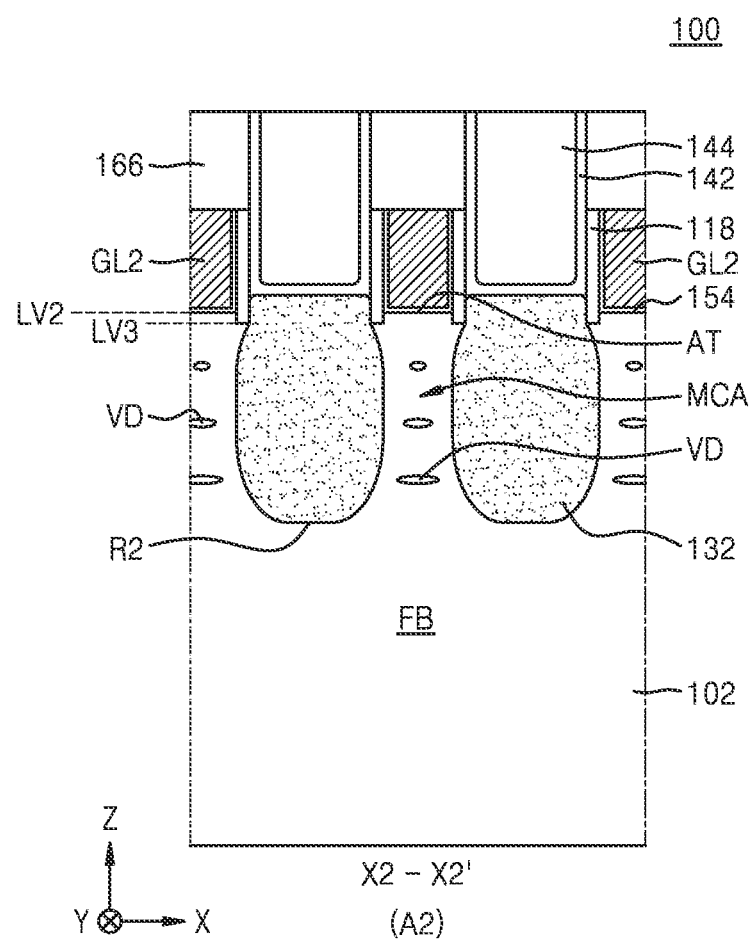
FIG. 2C is a cross-sectional view taken along line X2-X2' of FIG. 1.
Figure 2D:
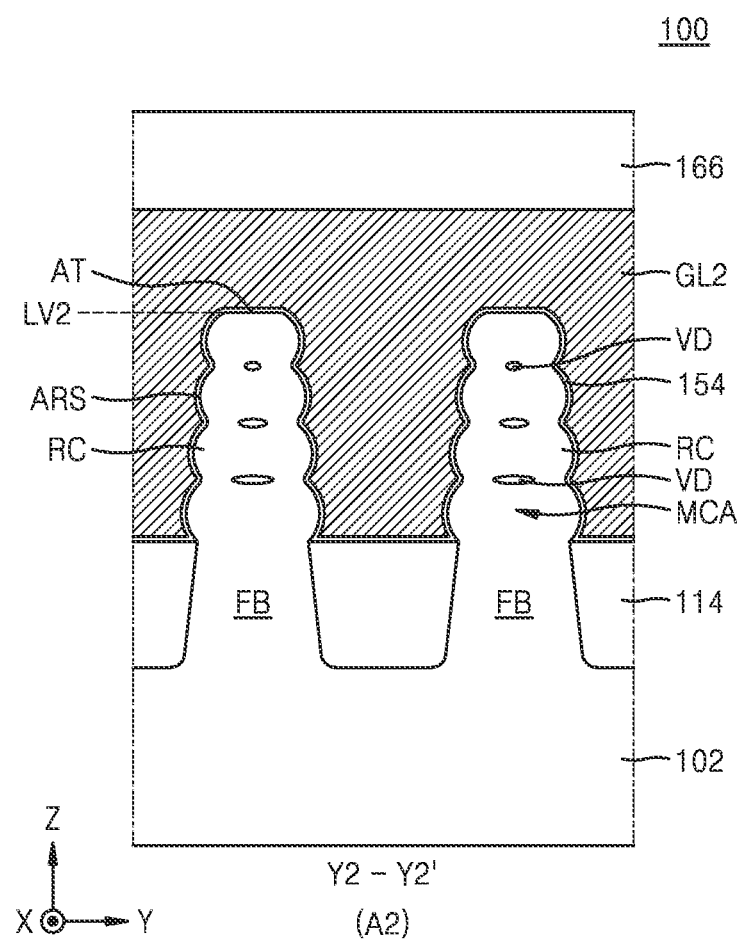
FIG. 2D is a cross-sectional view taken along line Y2-Y2' of FIG. 1.

FIG. 1 is a layout diagram of an integrated circuit (IC) device 100, according to some embodiments. FIG. 2A is a cross-sectional view taken along line X1-X1' of FIG. 1. FIG. 2B is a cross-sectional view taken along line Y1-Y1' of FIG. 1. FIG. 2C is a cross-sectional view taken along line X2-X2' of FIG. 1. FIG. 2D is a cross-sectional view taken along line Y2-Y2' of FIG. 1.

Referring to FIGS. 1 and 2A to 2D, the IC device 100 may have a substrate 102, which includes a first device region A1 and a second device region A2, which are spaced apart from each other in a lateral direction.

In some example embodiments, the first device region A1 and the second device region A2 may be regions configured to perform different functions. In other example embodiments, the first device region A1 and the second device region A2 may include devices having different operation modes. For example, the first device region A1 may be a region in which devices configured to operate in a relatively low power mode are formed, while the second device region A2 may be a region in which devices configured to operate in a relatively high power mode are formed.

A plurality of nanosheet transistors TR1 may be in the first device region A1, and a plurality of fin transistors TR2 may be in the second device region A2. The nanosheet transistor TR1 in the first device region A1 may be a low-voltage transistor that requires a high-speed operation and has a relatively low operating voltage, and the fin transistor TR2 in the second device region A2 may be a high-voltage transistor that generates a high voltage or transmits the high voltage. In an example, the nanosheet transistor TR1 may be a transistor having a relatively low operating voltage of about 0.5 V to about 10 V, and the fin transistor TR2 may be a transistor having a relatively high operating voltage of about 10 V or higher. However, an operating voltage range of each of the nanosheet transistor TR1 and the fin transistor TR2 is not limited to the example described above, and in some embodiments an operating voltage of the fin transistor TR2 may be variously selected in a wider range than that of an operating voltage of the nanosheet transistor TR1. As used herein, the first device region A1 may be referred to as a "a low-voltage transistor region," and the second device region A2 may be referred to as a "high-voltage transistor region."

In some embodiments, the first device region A1 may be a region in which a logic circuit or a memory device is formed, and the second device region A2 may be a region in which peripheral circuits, such as input/output (I/O) devices, are formed.

As shown in FIGS. 1, 2A, and 2B, the IC device 100 may include a plurality of first fin-type active regions FA and a plurality of nanosheet stacks NSS. The plurality of first fin-type active regions FA may protrude from the substrate 102 in a vertical direction (e.g., a Z direction) in the first device region A1 and extend in length in a first lateral direction (e.g., a X direction). The plurality of nanosheet stacks NSS may be on or above the plurality of first fin-type active regions FA. As used herein, the term "nanosheet" refers to a conductive structure having a cross-section that is substantially perpendicular to a direction in which current flows. The term nanosheet may encompass, for example, a nanowire.

As shown in FIGS. 1, 2C, and 2D, the IC device 100 may include a plurality of second fin-type active regions FB and a plurality of mesa-type channel regions MCA. The plurality of second fin-type active regions FB may protrude from or over the substrate 102 in the vertical direction (the Z direction) in the second device region A2 and extend in length in the first lateral direction (the X direction). Each of the plurality of mesa-type channel regions MCA may protrude from a respective one of the plurality of second fin-type active regions FB upward in the vertical direction (the Z direction). Each of the plurality of mesa-type channel regions MCA may be integrally connected to the respective one of the plurality of second fin-type active regions FB.

The substrate 102 may include a semiconductor (e.g., silicon (Si) or germanium (Ge)) or a compound semiconductor (e.g., silicon germanium (SiGe), silicon carbide (SiC), gallium arsenide (GaAs), indium arsenide (InAs), indium gallium arsenide (InGaAs), indium phosphide (InP), as examples). As used herein, each of the terms "SiGe," "SiC," "GaAs," "InAs," "InGaAs," and "InP" refers to a material including elements included therein, and is not intended to convey a chemical formula representing a stoichiometric relationship.

As shown in FIGS. 2B and 2D, in the first device region A1 and the second device region A2, a device isolation film 114 may be on the substrate 102 to cover both (first and second) sidewalls in a second lateral direction (e.g., the Y direction) of each of the plurality of first fin-type active regions FA and the plurality of second fin-type active regions FB. The device isolation film 114 may include an oxide film, a nitride film, or a combination thereof.

As shown in FIGS. 1, 2A, and 2B, a plurality of first gate lines GL1 may be on the plurality of first fin-type active regions FA in the first device region A1. Each of the plurality of first gate lines GL1 may extend in length in the second lateral direction (the Y direction), which intersects with the first lateral direction (the X direction). The plurality of nanosheet stacks NSS may be respectively on or above the plurality of first fin-type active regions FA at intersections between the plurality of first fin-type active regions FA and the plurality of first gate lines GL1. Each of the plurality of nanosheet stacks NSS may include a plurality of nanosheets (e.g., N1, N2, and N3), which overlap each other in the vertical direction (the Z direction) on the first fin-type active region FA. The plurality of nanosheets (e.g., N1, N2, and N3) may be at different vertical distances (Z-directional distances) from a top surface of the first fin-type active region FA in a vertical distance. The plurality of nanosheets (e.g., N1, N2, and N3) may include a first nanosheet N1, a second nanosheet N2, and a third nanosheet N3, which are sequentially stacked on the first fin-type active region FA. Each of the plurality of nanosheet stacks NSS may be spaced apart from the first fin-type active region FA in the vertical direction (the Z direction) and may face a fin top surface FT of the first fin-type active regions FA.

FIG. 1 illustrates a case in which the nanosheet stack NSS approximately has a rectangular planar shape, with the understanding that the present disclosure is not limited thereto. The nanosheet stack NSS may have various planar shapes according to a planar shape of each of the first fin-type active region FA and the first gate line GL1. The present example embodiment pertains to an example configuration in which the plurality of nanosheet stacks NSS and the plurality of first gate lines GL1 are on one first fin-type active region FA, and the plurality of nanosheet stacks NSS are arranged in a line (e.g., are colinear) in the first lateral direction (the X direction) on one first fin-type active region FA. However, the number of nanosheet stacks NSS and the number of first gate lines GL1 on one first fin-type active region FA are not specifically limited thereto.

Each of the first to third nanosheets N1, N2, and N3 may have a channel region. For example, a thickness of each of the first to third nanosheets N1, N2, and N3 may be selected in a range of about 4 nm to about 6 nm, without being limited thereto. Here, a thickness of each of the first to third nanosheets N1, N2, and N3 may refer to a size of each of the first to third nanosheets N1, N2, and N3 in a vertical direction (the Z direction). In some example embodiments, the first to third nanosheets N1, N2, and N3 may have substantially the same thickness in the vertical direction (the Z direction). In other example embodiments, at least some of the first to third nanosheets N1, N2, and N3 may have different thicknesses in the vertical direction (the Z direction).

In some example embodiments, as shown in FIGS. 2A and 2B, at least some of the first to third nanosheets N1, N2, and N3 included in one nanosheet stack NSS may have different sizes in the first lateral direction (the X direction) and/or in the second lateral direction (the Y direction). For example, as shown in FIG. 2B, the first to third nanosheets N1, N2, and N3 may have different widths in the second lateral direction (the Y direction), and have gradually increasing widths in the second lateral direction (the Y direction) toward the first fin-type active region FA. From among the first to third nanosheets N1, N2, and N3, a width of the first nanosheet N1, which is closest to the first fin-type active region FA, in the second lateral direction (the Y direction) may be greater than a width of the third nanosheet N3, which is farthest from the first fin-type active region FA, in the second lateral direction (the Y direction).

In some example embodiments, and in contrast to FIGS. 2A and 2B, at least some of the first to third nanosheets N1, N2, and N3 may have the same size in the first lateral direction (the X direction) and/or the second lateral direction (the Y direction).

As shown in FIG. 2A, a plurality of recesses R1 may be formed in the first fin-type active region FA in the first device region A1. A lowermost surface of each of the plurality of recesses R1 may be at a lower level than the fin top surface FT of the first fin-type active regions FA. As used herein, the "level" may refer to a distance from a top surface of the substrate 102 in a vertical direction (the Z direction or −Z direction).

A plurality of first source/drain regions 130 may be respectively inside the plurality of recesses R1. Each of the plurality of first source/drain regions 130 may have a sidewall (or sidewalls) facing the first to third nanosheets N1, N2, and N3 included in the nanosheet stack NSS (or stacks) adjacent thereto. Each of the plurality of first source/drain regions 130 may be in contact with the first to third nanosheets N1, N2, and N3 included in the nanosheet stack NSS adjacent thereto.

The plurality of first source/drain regions 130 may include an epitaxially grown semiconductor layer. In some example embodiments, the plurality of first source/drain regions 130 may include a Group IV element semiconductor, a Group IV-IV compound semiconductor, or a combination thereof. In some example embodiments, each of the plurality of first source/drain regions 130 may include a silicon layer doped with an n-type dopant, a silicon carbide layer doped with an n-type dopant, or a silicon germanium layer doped with a p-type dopant. For example, n-type dopant may be selected from phosphorus (P), arsenic (As), and antimony (Sb). For example, p-type dopant may be selected from boron (B) and gallium (Ga).

The plurality of first gate lines GL1 may cover the nanosheet stack NSS on the first fin-type active region FA and surround each of the first to third nanosheets N1, N2, and N3. Each of the plurality of first gate lines GL1 may include a main gate portion 160M and a plurality of sub-gate portions 160S. The main gate portion 160M may cover a top surface of the nanosheet stack NSS and extend in the second lateral direction (the Y direction). As best seen in FIG. 2B, the plurality of sub-gate portions 160S may be integrally connected to the main gate portion 160M and respectively arranged one by one among the first to third nanosheets N1, N2, and N3 and between the first nanosheet N1 and the first fin-type active region FA. In the vertical direction (the Z direction), a thickness of each of the plurality of sub-gate portions 160S may be less than a thickness of the main gate portion 160M.

The first gate line GL1 may include a metal, a metal nitride, a metal carbide, or a combination thereof. The metal may be selected from at least one metal selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may be titanium aluminum carbide (TiAlC). However, constituent materials of the first gate line GL1 are not limited to the examples described above.

A first gate dielectric film 152 may be between the nanosheet stack NSS and the first gate line GL1. The first gate dielectric film 152 may cover a bottom surface and sidewalls of the main gate portion 160M of the first gate line GL1.

In some example embodiments, the first gate dielectric film 152 may have a stack structure of an interface film and a high-k dielectric film. The interface film may include a low-k dielectric material film having a dielectric constant of about 9 or less, for example a silicon oxide film, a silicon oxynitride film, or a combination thereof. In some example embodiments, the interface film may be omitted. The high-k dielectric film may include a material having a higher dielectric constant than a silicon oxide film. For example, the high-k dielectric film may have a dielectric constant of about 10 to about 25. The high-k dielectric film may include hafnium oxide, without being limited thereto.

As seen in FIG. 1, the first device region A1, the plurality of nanosheet transistors TR1 may be formed at intersections between the plurality of first fin-type active regions FA and the plurality of first gate lines GL1.

In some example embodiments, the first to third nanosheets N1, N2, and N3 may include semiconductor layers including the same element. In an example, each of the first to third nanosheets N1, N2, and N3 may include a silicon layer. In some example embodiments, the first to third nanosheets N1, N2, and N3 may include an undoped silicon layer. In other example embodiments, the first to third nanosheets N1, N2, and N3 may include a silicon layer doped with a dopant of the same conductivity type as that of the first source/drain region 130. In still other example embodiments, the first to third nanosheets N1, N2, and N3 may include a silicon layer doped with a dopant of a conductivity type opposite to that of the first source/drain region 130.

As shown in FIGS. 1, 2C, and 2D, a plurality of second gate lines GL2 may be on the plurality of second fin-type active regions FB in the second device region A2. Each of the plurality of second gate lines GL2 may extend in length in the second lateral direction (the Y direction). The first gate line GL1 in the first device region A1 may have a first width W1 in the first lateral direction (the X direction), and the second gate line GL2 in the second device region A2 may have a second width W2 in the first lateral direction (the X direction). The second width W2 may be greater than or equal to the first width W1. A constituent material of the plurality of second gate lines GL2 may be substantially that of the first gate line GL1, which has been described above.

The plurality of mesa-type channel regions MCA may be respectively on the plurality of second fin-type active regions FB at intersections between the plurality of second fin-type active regions FB and the plurality of second gate lines GL2. Each of the plurality of mesa-type channel regions MCA may be integrally connected to the second fin-type active region FB. As shown in FIG. 2D, each of the plurality of mesa-type channel regions MCA may be surrounded substantially by the second gate line GL2.

In some example embodiments, the second fin-type active region FB may include the same material as the plurality of mesa-type channel regions MCA. For example, each of the second fin-type active region FB and the plurality of mesa-type channel regions MCA may include a silicon layer. In some example embodiments, the plurality of mesa-type channel regions MCA may include an undoped silicon layer, a silicon layer doped with a p-type dopant, or a silicon layer doped with an n-type dopant. In some example embodiments, each of the plurality of mesa-type channel regions MCA may include the same constituent material as that of the first to third nanosheets N1, N2, and N3 in the first device region A1.

As shown in FIG. 2D, the mesa-type channel region MCA may include a plurality of round convex portions RC, which are convex toward the second gate line GL2. The mesa-type channel region MCA may include a concavo-convex sidewall ARS, which includes a portion of each of the plurality of round convex portions RC and faces the second gate line GL2. The mesa-type channel region MCA may include a plurality of voids VD, which are inside the mesa-type channel region MCA.

The plurality of round convex portions RC may be in a line or may be colinear in the vertical direction (the Z direction) in the mesa-type channel region MCA. In the second lateral direction (the Y direction), which is a lengthwise direction of the second gate line GL2, a greatest width of each of the plurality of round convex portions RC may be gradually reduced in a direction away from the substrate 102.

As shown in FIGS. 2C and 2D, a plurality of voids VD may be in a line or may be colinear in the vertical direction (the Z direction) inside the mesa-type channel region MCA. The plurality of voids VD inside one mesa-type channel region MCA may have smaller sizes in a direction away from the substrate 102. As used herein, a size of each of the plurality of voids VD may refer to a volume of each of the plurality of voids VD. From among the plurality of voids VD inside one mesa-type channel region MCA, a size of the void VD closest to the substrate 102 may be greater than a size of the void VD farthest from the substrate 102. In some example embodiments, a length of the plurality of voids VD inside one mesa-type channel region MCA in the lateral direction (e.g., the second lateral direction) may be gradually reduced in a direction away from the substrate 102.

In some example embodiments, each of the plurality of voids VD may include the air or gases that may be present during a process of manufacturing the IC device 100. In some example embodiments, each of the plurality of voids VD may include a gas including the same element as a constituent element of a semiconductor material included in the mesa-type channel region MCA. For example, each of the plurality of voids VD may be filled with a gas including silicon atoms, hydrogen atoms, chlorine atoms, or a combination thereof.

As shown in FIG. 2C, a plurality of recesses R2 may be formed in an upper portion of the second fin-type active region FB in the second device region A2. A plurality of second source/drain regions 132 may be respectively in the plurality of recesses R2. In the first lateral direction (the X direction), a width of the mesa-type channel region MCA may be defined by two adjacent recesses R2 of the plurality of recesses R2. The mesa-type channel region MCA may have surfaces in contact with a pair of second source/drain regions 132, which are adjacent to each other on both sides of the mesa-type channel region MCA. A lowermost surface of each of the plurality of second source/drain regions 132 may be closer to the substrate 102 than the void VD, which is closest to the substrate 102, from among the plurality of voids VD included in the mesa-type channel region MCA. A constituent material of the plurality of second source/drain regions 132 may be substantially the same as that of the plurality of first source/drain regions 130.

As shown in FIG. 2D, a greatest width of the mesa-type channel region MCA in the second lateral direction (the Y direction) may be greater than a smallest width of the second fin-type active region FB, which is integrally connected to the mesa-type channel region MCA.

In some example embodiments, on the substrate 102, each of the plurality of voids VD inside one mesa-type channel region MCA may be at the same vertical level as each of the plurality of sub-gate portions 160S included in the first gate line GL1 in the first device region A1. For example, the sub-gate portion 160S, which is closest to the substrate 102 from among the plurality of sub-gate portions 160S in the first device region A1, may be at the same vertical level on the substrate 102 as the void VD, which is closest to the substrate 102 from among the plurality of voids VD inside the mesa-type channel region MCA in the second device region A2. In addition, the sub-gate portion 160S, which is farthest from the substrate 102 from among the plurality of sub-gate portions 160S in the first device region A1, may be at the same vertical level on the substrate 102 as the void VD, which is farthest from the substrate 102 from among the plurality of voids VD inside the mesa-type channel region MCA in the second device region A2. Stated differently respective ones of the plurality of voids VD and the plurality of sub-gate portions 160S may be equidistant from the substrate 102.

As shown in FIGS. 2C and 2D, a second gate dielectric film 154 may be between the mesa-type channel region MCA and the second gate line GL2 in the second device region A2. The second gate dielectric film 154 may cover a bottom surface and sidewalls of the second gate line GL2. A detailed configuration of the second gate dielectric film 154 may be substantially the same as the first gate dielectric film 152. However, the second gate dielectric film 154 may include a concavo-convex portion that faces the plurality of round convex portions RC of the mesa-type channel region MCA. In the second device region A2, each of the plurality of second gate lines GL2 may include a concavo-convex portion that faces the plurality of round convex portions RC of the mesa-type channel region MCA.

As best seen in FIG. 1, in the second device region A2, a plurality of fin transistors TR2 may be formed at intersections between the plurality of second fin-type active regions FB and the plurality of second gate lines GL2.

In the first device region A1 and the second device region A2, a plurality of insulating spacers 118 may cover both sidewalls of each of the plurality of first gate lines GL1 and the plurality of second gate lines GL2.

In the first device region A1, the plurality of insulating spacers 118 may cover both sidewalls of the main gate portion 160M of the first gate line GL1 on the top surfaces of the plurality of nanosheet stacks NS S. In the first device region A1, each of the plurality of insulating spacers 118 may be spaced apart from the first gate line GL1 with the first gate dielectric film 152 therebetween.

In the second device region A2, the plurality of insulating spacers 118 may cover both sidewalls of the second gate line GL2 on a top surface of the mesa-type channel region MCA. In the second device region A2, each of the plurality of insulating spacers 118 may be spaced apart from the second gate line GL2 with the second gate dielectric film 154 therebetween.

The third nanosheet N3, which is an uppermost one of the first to third nanosheets N1, N2, and N3 in the first device region A1, may have an uppermost surface that is farthest from the substrate 102. The uppermost surface of the third nanosheet N3 may extend in the lateral direction at a first vertical level LV1 on the substrate 102. The mesa-type channel region MCA in the second device region A2 may have an uppermost surface AT, which is farthest from the substrate 102. The uppermost surface AT of the mesa-type channel region MCA may be at a second vertical level LV2 on the substrate 102. The second vertical level LV2 may be farther from the substrate 102 than the first vertical level LV1.

In the second device region A2, the top surface of the mesa-type channel region MCA may include a first top surface unit that faces a second gate line GL2 and a second top surface unit that faces the insulating spacer 118. The first top surface unit may be in contact with the second gate dielectric film 154 and include the uppermost surface AT of the mesa-type channel region MCA, which extends in a lateral direction (e.g., the X direction) at the second vertical level LV2. The second top surface unit may be in contact with a bottom surface of the insulating spacer 118 that extends in the same lateral direction, but at a third vertical level LV3 that is lower than the second vertical level LV2. The third vertical level LV3 may be closer to the substrate 102 than the second vertical level LV2.

Each of the plurality of insulating spacers 118 may include silicon nitride (SiN), silicon oxide (SiO), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiN," "SiO," "SiCN," "SiBN," "SiON," "SiOCN," "SiBCN" and "SiOC" refers to a material including elements included therein, and is not intended to convey a chemical formula representing a stoichiometric relationship.

As shown in FIGS. 2A and 2B, a top surface of each of the plurality of first gate lines GL1 may be covered by a first capping insulating pattern 164 in the first device region A1. As shown in FIGS. 2C and 2D, a top surface of each of the plurality of second gate lines GL2 may be covered by a second capping insulating pattern 166 in the second device region A2. The first capping insulating pattern 164 and the second capping insulating pattern 166 may include a silicon nitride film.

As shown in FIG. 2A, in the first device region A1, each of the plurality of first source/drain regions 130 may include a portion that overlaps or is overlapped by the insulating spacer 118 in the vertical direction (the Z direction). For example, the portion of each of the plurality of first source/drain regions 130 that overlaps or is overlapped by the insulating spacer 118 in the vertical direction (the Z direction) may have a selected width in a range of about 0 nm to about 4 nm in the first lateral direction (the X direction), without being limited thereto.

As shown in FIG. 2C, in the second device region A2, each of the plurality of second source/drain regions 132 may include a portion that overlaps or is overlapped by the insulating spacer 118 in the vertical direction (the Z direction). For example, the portion of each of the plurality of second source/drain regions 132 that overlaps the insulating spacer 118 in the vertical direction (the Z direction) may have a width selected in the range of about 0 nm to about 4 nm in the first lateral direction (the X direction), without being limited thereto.

As shown FIGS. 2A and 2C, in the first device region A1 and the second device region A2, each of the plurality of first source/drain regions 130, the plurality of second source/drain regions 132, and the plurality of insulating spacers 118 may be covered by an insulating liner 142. The insulating liner 142 may include SiN, SiO, SiCN, SiBN, SiON, SiOCN, SiBCN, SiOC, or a combination thereof. In some example embodiments, the insulating liner 142 may be omitted. An inter-gate dielectric film 144 may be on the insulating liner 142. The inter-gate dielectric film 144 may include a silicon nitride film, a silicon oxide film, SiON, SiOCN, or a combination thereof. When the insulating liner 142 is omitted, the inter-gate dielectric film 144 may be in contact with the plurality of first source/drain regions 130 and the plurality of second source/drain regions 132.

In the IC device 100, the plurality of nanosheet transistors TR1 including the first to third nanosheets N1, N2, and N3 may be arranged in the first device region A1, and the plurality of fin transistors TR2 including the mesa-type channel region MCA may be arranged in the second device region A2. Accordingly, different electrical properties desired in the first device region A1 and the second device region A2 may be optimized or selected for each device region. In particular, in the second device region A2, because the mesa-type channel region MCA included in each of the plurality of fin transistors TR2 includes a concavo-convex sidewall ARS formed by the plurality of round convex portions RC that face the second gate line GL2 with the second gate dielectric film 154 therebetween, a surface area of the mesa-type channel region MCA may be greater than when the mesa-type channel region MCA does not include the concavo-convex sidewall ARS. Thus, a channel length of each of the plurality of fin transistors TR2 may be increased. Accordingly, the electrical properties of each of the plurality of fin transistors TR2 may be improved. Accordingly, even though the IC device 100 may include a device having a reduced area (e.g., due to downscaling), the reliability of the IC device 100 may be improved by adopting different structures in the first device region A1 and the second device region A2 according to operating voltages used in the first device region A1 and the second device region A2.

Figure 3A:
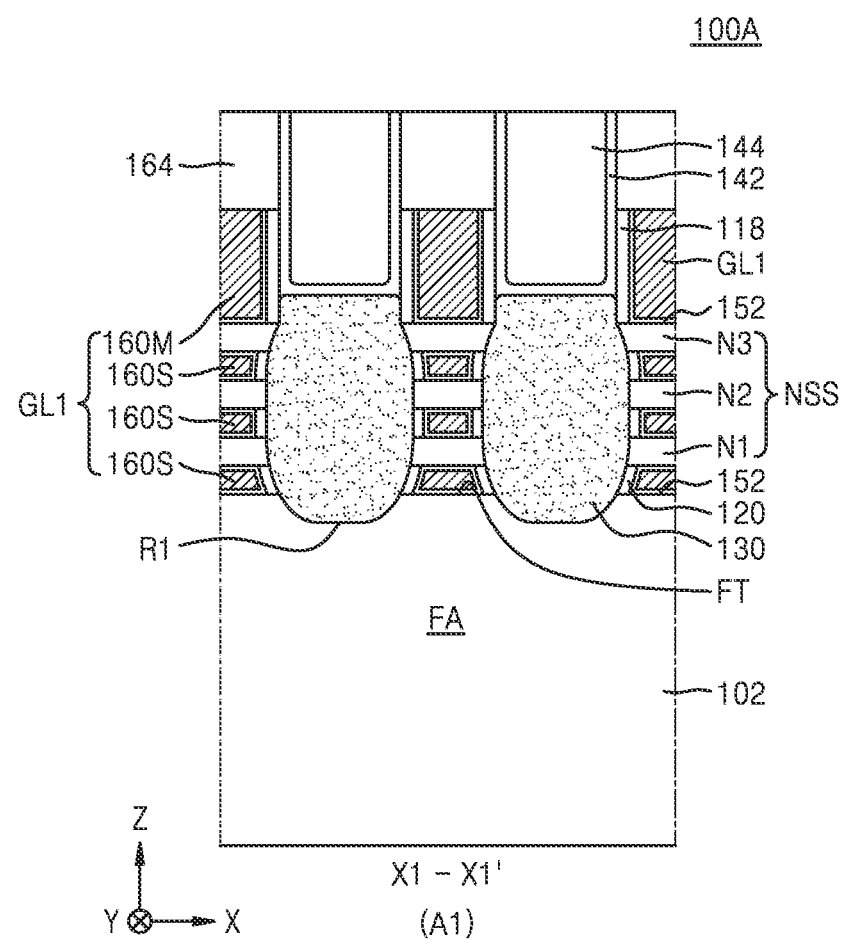
FIGS. 3A, 3B, and 3C are cross-sectional views of IC devices according to some embodiments.

FIG. 3A is a cross-sectional view of an IC device 100A according to some embodiments. FIG. 3A illustrates some components of a portion corresponding to a cross-section taken along line X1-X1' of FIG. 1. In FIG. 3A, the same reference numerals are used to denote the same elements as in FIG. 2A, and detailed descriptions thereof are omitted.

Referring to FIG. 3A, the IC device 100A may have substantially the same configuration as the IC device 100 described with reference to FIGS. 1 and 2A to 2D. However, in some embodiments, the IC device 100A may further include a plurality of inner insulating spacers 120, which are respectively among the first to third nanosheets N1, N2, and N3 and between the first nanosheet N1 and the first fin-type active region FA in a first device region A1. Also, the plurality of inner insulating spacers 120 may be between a plurality of sub-gate portions 160S and a first source/drain region 130.

Both sidewalls of each of the plurality of sub-gate portions 160S may be covered by the inner insulating spacers 120 with a first gate dielectric film 152 therebetween. Each of the plurality of sub-gate portions 160S may be spaced apart from the first source/drain region 130 with the first gate dielectric film 152 and the inner insulating spacer 120 therebetween. Each of the plurality of inner insulating spacers 120 may be in contact with the first source/drain region 130. At least some of the plurality of inner insulating spacers 120 may overlap insulating spacers 118 in the vertical direction (the Z direction).

The plurality of inner insulating spacers 120 may include silicon nitride, silicon oxide, SiCN, SiBN, SiON, SiOCN, SiBCN, SiOC, or a combination thereof, as examples. In some example embodiments, at least some of the plurality of inner insulating spacers 120 may further include air gaps. In some example embodiments, the inner insulating spacer 120 may include the same material as the insulating spacers 118. In other example embodiments, the insulating spacers 118 may include a different material from the inner insulating spacer 120.

The plurality of first source/drain regions 130 may be opposite to the plurality of sub-gate portions 160S with the inner insulating spacer 120 and the first gate dielectric film 152 therebetween in the first lateral direction (the X direction). Each of the plurality of first source/drain regions 130 may not include a portion in contact with the first gate dielectric film 152.

Figure 3B:
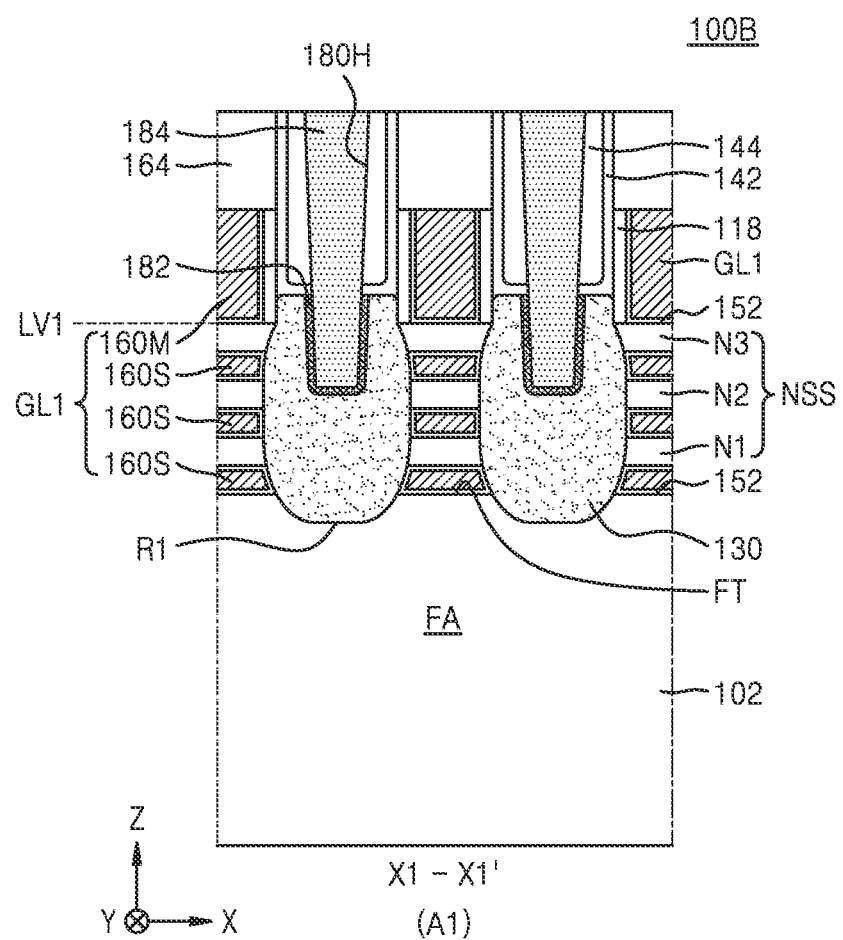

FIG. 3B is a cross-sectional view of an IC device 100B according to some embodiments. FIG. 3B illustrates some components of a portion corresponding to a cross-section taken along line X1-X1' of FIG. 1. In FIG. 3B, the same reference numerals are used to denote the same elements as in FIG. 2A, and detailed descriptions thereof are omitted.

Referring to FIG. 3B, the IC device 100B may have substantially the same configuration as the IC device 100 described with reference to FIGS. 1 and 2A to 2D. However, in some embodiments the IC device 100B may further include a plurality of source/drain contacts 184 on a plurality of first source/drain regions 130 in a first device region A1. A metal silicide film 182 may be between the first source/drain region 130 and the source/drain contact 184. Each of the plurality of source/drain contacts 184 may fill a contact hole 180H, which may pass through the inter-gate dielectric film 144 and the insulating liner 142 in the vertical direction (the Z direction) and may extend into the first source/drain region 130. The first source/drain region 130 may be spaced apart from the source/drain contact 184 with the metal silicide film 182 therebetween. The first source/drain region 130 may surround a lower portion of each of the plurality of source/drain contacts 184 outside the contact 180H.

The metal silicide film 182 may include titanium silicide, without being limited thereto. In some embodiments, the metal silicide film 182 may be omitted. Each of the plurality of source/drain contacts 184 may include a metal, a conductive metal nitride, or a combination thereof, as examples. For example, each of the plurality of source/drain contacts 184 may include tungsten (W), copper (Cu), aluminum (Al), titanium (Ti), tantalum (Ta), titanium nitride (TiN), tantalum nitride (TaN), an alloy thereof, or a combination thereof.

Figure 3C:
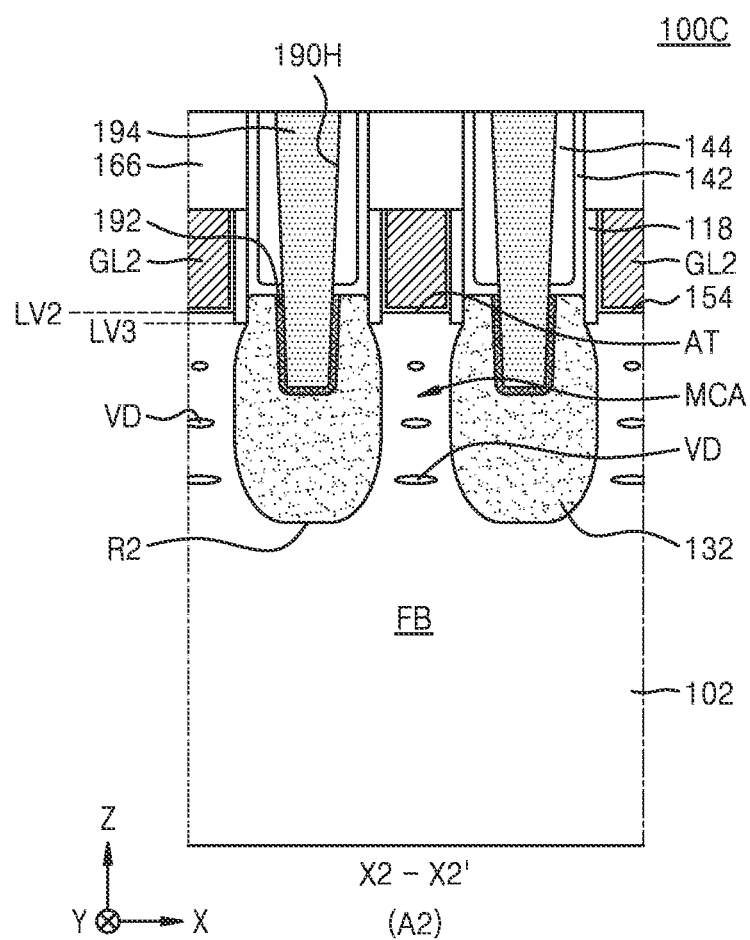

FIG. 3C is a cross-sectional view of an IC device 100C according to some embodiments. FIG. 3C illustrates some components of a portion corresponding to a cross-section taken along line X2-X2' of FIG. 1. In FIG. 3C, the same reference numerals are used to denote the same elements as in FIG. 2C, and detailed descriptions thereof are omitted.

Referring to FIG. 3C, the IC device 100C may have substantially the same configuration as the IC device 100 described with reference to FIGS. 1 and 2A to 2D. However, in some embodiments the IC device 100C may further include a plurality of source/drain contacts 194 on the plurality of second source/drain regions 132 in a second device region A2. A metal silicide film 192 may be between the second source/drain region 132 and the source/drain contact 194. Each of the plurality of source/drain contacts 194 may fill a contact hole 190H, which may pass through an inter-gate dielectric film 144 and an insulating liner 142 in a vertical direction (the Z direction) and may extend into the second source/drain region 132. The second source/drain region 132 may be spaced apart from the source/drain contact 194 with the metal silicide film 192 therebetween. The second source/drain region 132 may surround a lower portion of each of the plurality of source/drain contacts 194 outside the contact hole 190H. Detailed configurations of the metal silicide film 192 and the source/drain contact 194 may be substantially the same as those of the metal silicide film 182 and the source/drain contact 184, which have been described with reference to FIG. 3B.

Figure 4:
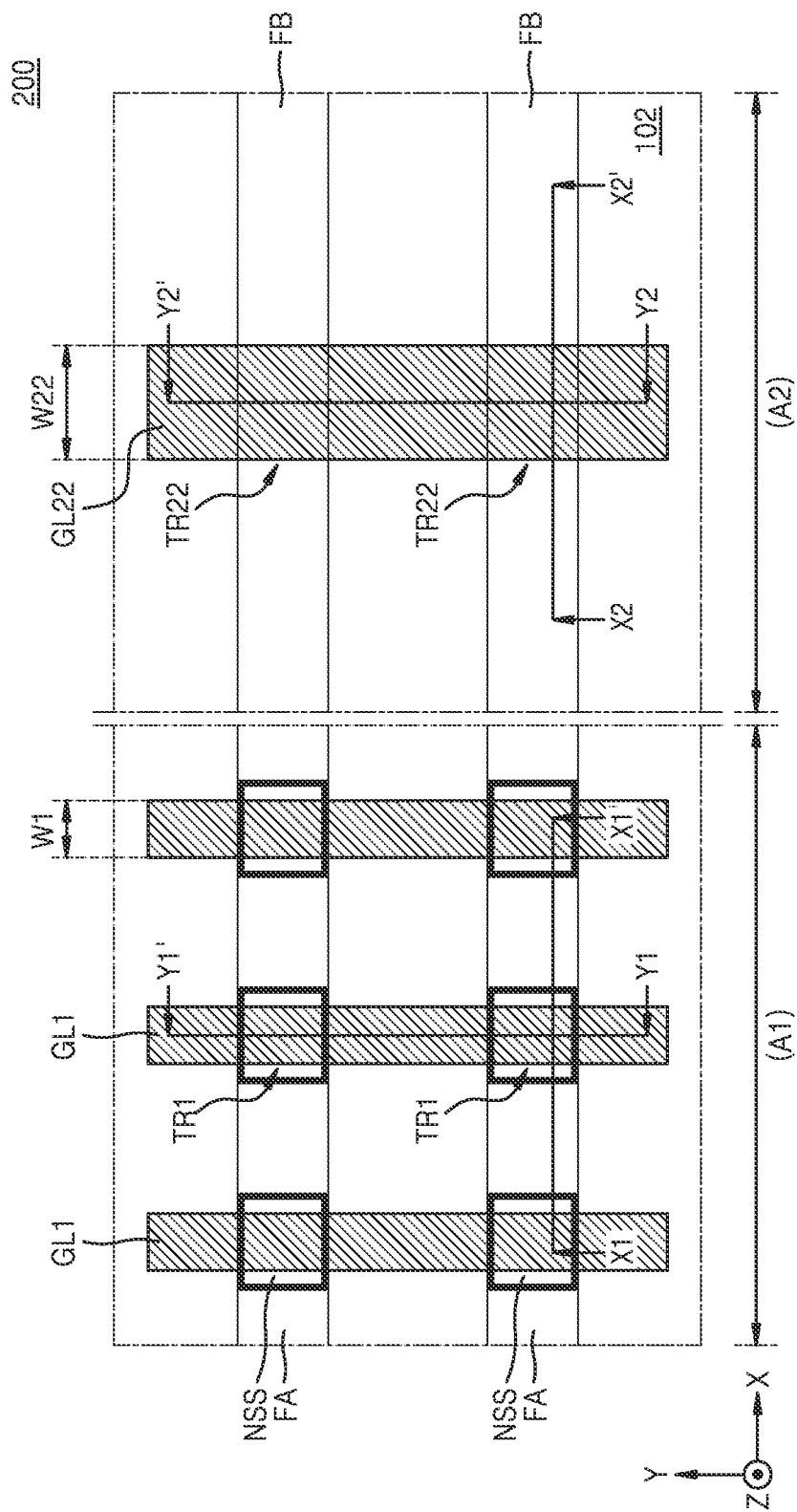
FIG. 4 is a plan layout diagram of an IC device according to some embodiments.
Figure 5A:
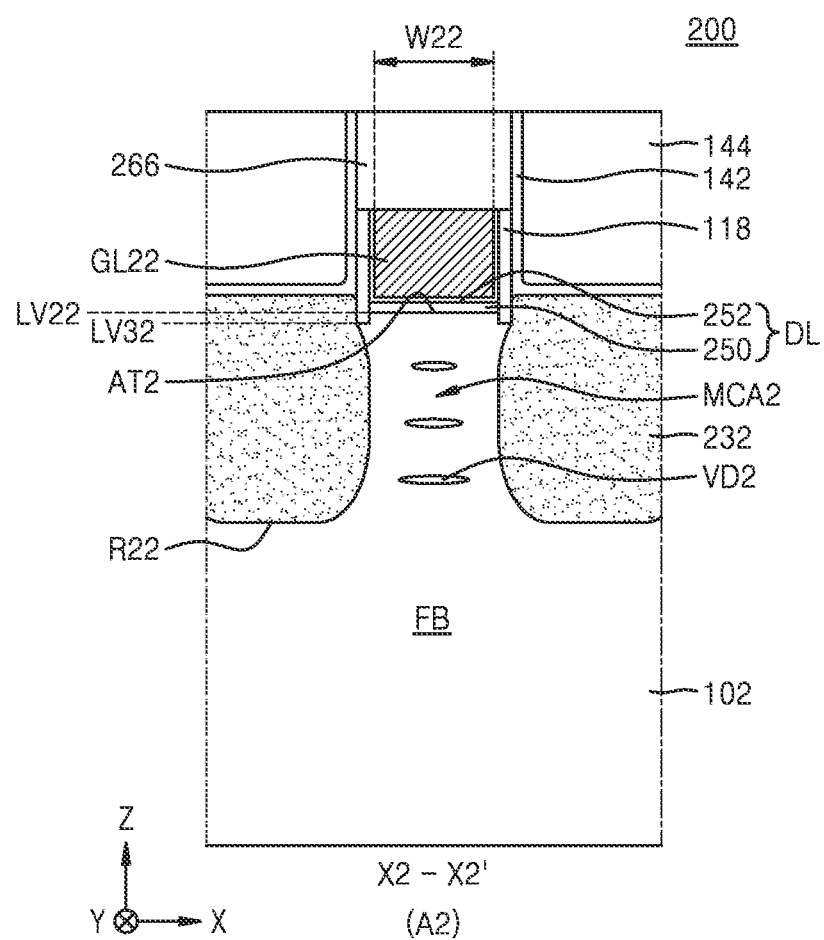
FIG. 5A is a cross-sectional view taken along line X2-X2' of FIG. 4.
Figure 5B:
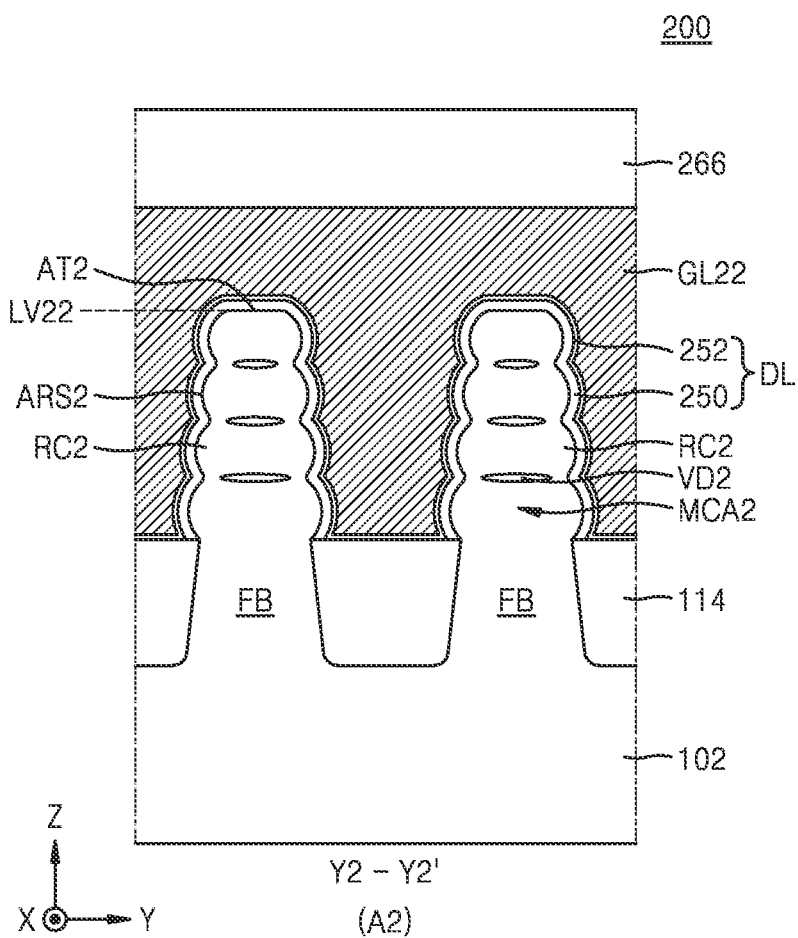
FIG. 5B is a cross-sectional view taken along line Y2-Y2' of FIG. 4.

FIG. 4 is a plan layout diagram of some components of an IC device 200 according to some embodiments. FIG. 5A is a cross-sectional view taken along line X2-X2' of FIG. 4, and FIG. 5B is a cross-sectional view taken along line Y2-Y2' of FIG. 4. In FIGS. 4, 5A, and 5B, the same reference numerals are used to denote the same elements as in FIGS. 1 and 2A to 2D, and detailed descriptions thereof are omitted.

Referring to FIGS. 4, 5A, and 5B, the IC device 200 may have substantially the same configuration as the IC device 100 described with reference to FIGS. 1 and 2A to 2D. In the first device region A1, a cross-sectional configuration taken along line X1-X1' of FIG. 4 and a cross-sectional configuration taken along line Y1-Y1' of FIG. 4 may be the same as described with reference to FIGS. 2A and 2B. However, as shown in FIGS. 5A and 5B, the IC device 200 may include a plurality of second fin-type active regions FB and a plurality of mesa-type channel regions MCA2. The plurality of second fin-type active regions FB may protrude from or over a substrate 102 in a vertical direction (the Z direction) in a second device region A2 and extend in length in a first lateral direction (the X direction). The plurality of mesa-type channel regions MCA2 may respectively protrude from or over the plurality of second fin-type active regions FB upward in the vertical direction (the Z direction) and be integrally connected to the second fin-type active region FB.

As shown in FIG. 5A, a plurality of recesses R22 may be in the second fin-type active region FB in the second device region A2. A plurality of second source/drain regions 232 may be respectively inside the plurality of recesses R22. In the first lateral direction (the X direction), a width of the mesa-type channel region MCA2 may be defined by a pair of recesses R22, which are adjacent to each other, from among the plurality of recesses R22. The mesa-type channel region MCA2 may have surfaces in contact with a pair of second source/drain regions 232, which are adjacent to each other on both sides of the mesa-type channel region MCA2.

A constituent material of the plurality of second source/drain regions 232 may be substantially the same as that of the plurality of first source/drain regions 130, which has been described with reference to FIG. 2A.

A plurality of second gate lines GL22 may be on the plurality of second fin-type active regions FB in the second device region A2. Each of the plurality of second gate lines GL22 may have substantially the same configuration as the second gate line GL2 described with reference to FIGS. 1, 2C, and 2D. However, the second gate line GL22 may have a greater width than the first gate line GL1 in the first device region A1 in a first lateral direction (the X direction). The first gate line GL1 may have a first width W1 in the first lateral direction (the X direction), and the second gate line GL22 may have a second width W22 in the first lateral direction (the X direction). The second width W22 may be greater than the first width W1. For example, the second width W22 may be at least 1.5 times greater than the first width W1.

As shown in FIG. 5B, each of the plurality of mesa-type channel regions MCA2 may be surrounded substantially by the second gate line GL22. A detailed configuration of each of the plurality of mesa-type channel regions MCA2 may be substantially the same as that of the mesa-type channel region MCA, which has been described with reference to FIGS. 2C and 2D. Each of the plurality of mesa-type channel regions MCA2 may include an undoped silicon layer, a silicon layer doped with a p-type dopant, or a silicon layer doped with an n-type dopant. In some example embodiments, the plurality of mesa-type channel regions MCA2 may include the same constituent material as the first to third nanosheets N1, N2, and N3 in the first device region A1.

As shown in FIG. 5B, the mesa-type channel region MCA2 may include a plurality of round convex portions RC2, which are convex toward the second gate line GL22. The mesa-type channel region MCA2 may include a concavo-convex sidewall ARS2, which includes a portion of each of the plurality of round convex portions RC and faces the second gate line GL22. The mesa-type channel region MCA2 may include a plurality of voids VD2, which may be inside the mesa-type channel region MCA2.

The plurality of round convex portions RC2 may be arranged in a line (e.g., are colinear) in the vertical direction (the Z direction) in the mesa-type channel region MCA2. In a second lateral direction (the Y direction), which is a lengthwise direction of the second gate line GL22, a greatest width of each of the plurality of round convex portions RC2 may be gradually reduced in a direction away from the substrate 102.

A plurality of voids VD2 may be arranged in a line (e.g., are colinear) in the vertical direction (the Z direction) inside the mesa-type channel region MCA2. A size of the plurality of voids VD2 inside one mesa-type channel region MCA2 may be reduced in a direction away from the substrate 102. A detailed configuration of each of the plurality of voids VD2 may be substantially the same as that of the void VD, which has been described with reference to FIGS. 2C and 2D.

As shown in FIGS. 5A and 5B, a second gate dielectric film DL may be between the mesa-type channel region MCA2 and the second gate line GL22 in the second device region A2. The second gate dielectric film DL may include a lower gate dielectric film 250 and an upper gate dielectric film 252. The lower gate dielectric film 250 may cover an outer surface of the mesa-type channel region MCA2. The upper gate dielectric film 252 may be spaced apart from the mesa-type channel region MCA2 with the lower gate dielectric film 250 therebetween, and the upper gate dielectric film 252 may be in contact with the second gate line GL22. In some example embodiments, the lower gate dielectric film 250 may include a low-k dielectric material film having a dielectric constant of about 9 or less, for example a silicon oxide film, a silicon oxynitride film, or a combination thereof. The upper gate dielectric film 252 may include a high-k dielectric film having a higher dielectric constant than a silicon oxide film. For example, the high-k dielectric film may have a dielectric constant of about 10 to about 25. The high-k dielectric film may include hafnium oxide, without being limited thereto.

A thickness of a portion of the second gate dielectric film DL between the mesa-type channel region MCA2 and the second gate line GL22 in the second device region A2 may be greater than a thickness of the first gate dielectric film 152 (refer to FIGS. 2A and 2B) in the first device region A1. For example, of the first gate dielectric film 152 shown in FIGS. 2A and 2B, a portion between any one of the first to third nanosheets N1, N2, and N3 and the first gate line GL1 may have a first thickness. Of the second gate dielectric film DL in the second device region A2, a portion between the mesa-type channel region MCA2 and the second gate line GL22 may have a second thickness, which is greater than the first thickness.

In the second device region A2, the lower gate dielectric film 250 and the upper gate dielectric film 252, which are in the second gate dielectric film DL, and the plurality of second gate lines GL22 may each include a concavo-convex portion, which may face the plurality of round convex portions RC2 of the mesa-type channel region MCA2.

In the second device region A2, a plurality of fin transistors TR22 may be formed at intersections between the plurality of second fin-type active regions FB and the plurality of second gate lines GL22.

An uppermost surface AT2 of the mesa-type channel region MCA2 may be at the second vertical level LV22 on the substrate 102. The second vertical level LV22 may be farther from the substrate 102 than the first vertical level LV1 (refer to FIGS. 2A and 2B), which is a level of the uppermost surface of the third nanosheet N3, which is the uppermost one of the first to third nanosheets N1, N2, and N3 in the first device region A1.

In the second device region A2, a plurality of insulating spacers 118 may cover both sidewalls of the second gate line GL22 on a top surface of the mesa-type channel region MCA2. The top surface of the mesa-type channel region MCA2 may include a first top surface unit that faces the second gate line GL22 and a second top surface unit that faces the insulating spacer 118. The first top surface unit may be in contact with the second gate dielectric film DL and include the uppermost surface AT2 of the mesa-type channel region MCA2, which may extend in a lateral direction at the second vertical level LV22. The second top surface unit may be in contact with a bottom surface of the insulating spacer 118 and may extend in the lateral direction at the third vertical level LV32 that is lower than the second vertical level LV22. The third vertical level LV32 may be closer to the substrate 102 than the second vertical level LV22.

A top surface of each of the plurality of second gate lines GL22 may be covered by a second capping insulating pattern 266. The second capping insulating pattern 266 may include a silicon nitride film.

In the IC device 200, a plurality of nanosheet transistors TR1 including the first to third nanosheets N1, N2, and N3 may be arranged in the first device region A1, and the plurality of fin transistors TR22 including the mesa-type channel region MCA2 may be arranged in the second device region A2. Accordingly, different electrical properties desired in the first device region A1 and the second device region A2 may be optimized or selected for each device region. In particular, in the second device region A2, because the mesa-type channel region MCA2 included in each of the plurality of fin transistors TR22 includes the concavo-convex sidewall ARS formed by the plurality of round convex portions RC2 that face the second gate line GL22 with the second gate dielectric film DL therebetween, a surface area of the mesa-type channel region MCA2 may be greater than when the mesa-type channel region MCA2 does not include the concavo-convex sidewall ARS2. Thus, a channel length of each of the plurality of fin transistors TR22 may be increased. Accordingly, the electrical properties of each of the plurality of fin transistors TR22 may be improved. Accordingly, even though the IC device 200 may include a device region having a reduced area (e.g., due to the downscaling of IC devices), the reliability of the IC device 200 may be improved by adopting a different structure for the first device region A1 and the second device region A2 according to an operating voltage used for the first device region A1 and the second device region A2.

FIGS. 6A to 16B are diagrams of a process sequence of a method of manufacturing an IC device, according to some embodiments, wherein FIGS. 6A, 7A, 8 to 11, 12A, 13A, 14A, 15A, and 16A are each cross-sectional views of a configuration corresponding to cross-sections taken along lines X1-X1' and X2-X2' of FIG. 4, according to the process sequence, and FIGS. 6B, 7B, 12B, 13B, 14B, 15B, and 16B are each cross-sectional views of a configuration corresponding to cross-sections taken along lines Y1-Y1' and Y2-Y2' of FIG. 4, according to the process sequence. A method of manufacturing the IC device 200 shown in FIGS. 4, 5A, and 5B, according to some example embodiments, will be described with reference to FIGS. 6A to 16B. In FIGS. 6A to 16B, the same reference numerals are used to denote the same elements as in FIGS. 1 to 5B, and detailed descriptions thereof are omitted.

Figure 6A:
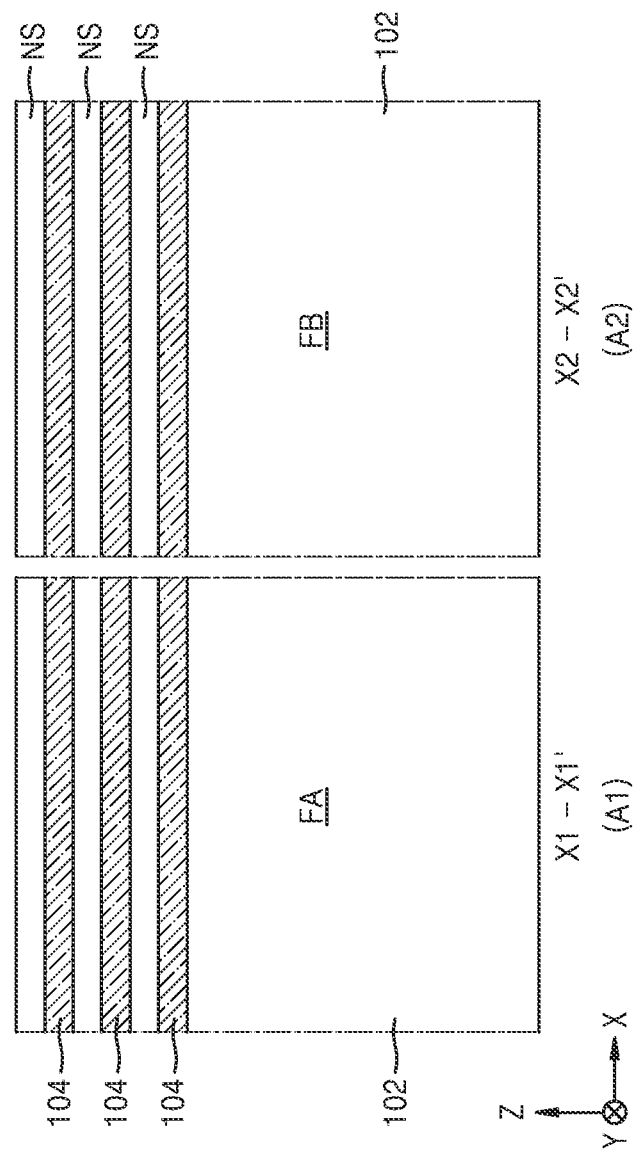
Figure 6B:
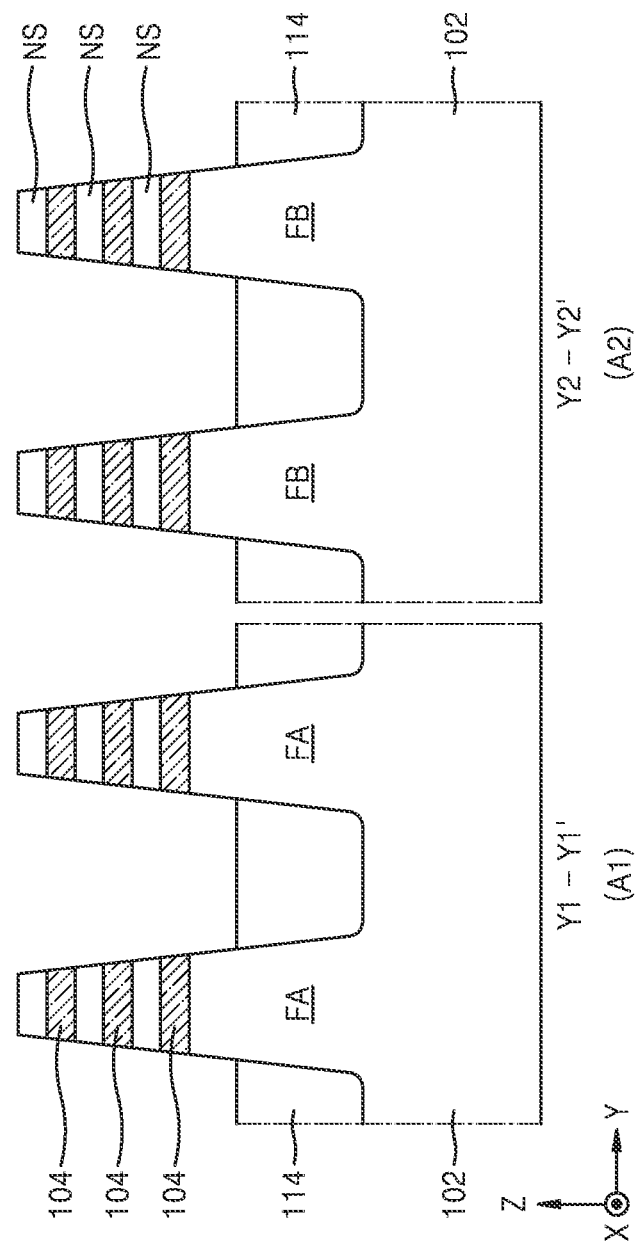

Referring to FIGS. 6A and 6B, a plurality of sacrificial semiconductor layers 104 and a plurality of nanosheet semiconductor layers NS may be alternately stacked one by one on a substrate 102 in a first device region A1 and a second device region A2. Thereafter, portions of the plurality of sacrificial semiconductor layers 104, the plurality of nanosheet semiconductor layers NS, and the substrate 102 may be etched, and thus, a plurality of first fin-type active regions FA may be formed in the first device region A1 of the substrate 102, and a plurality of second fin-type active regions FB may be formed in the second device region A2 of the substrate 102. Thereafter, a device isolation film 114 may be formed to cover sidewalls of each of the plurality of first fin-type active regions FA and the plurality of second fin-type active regions FB. The device isolation film 114 may cover first and second sidewalls in a second lateral direction (e.g., the Y direction) of the first fin-type active regions FA and the second fin-type active regions FB. A top surface of the device isolation film 114 may be at a lower level than a top surface of each of the plurality of first fin-type active regions FA and the plurality of second fin-type active regions FB.

In the first device region A1 and the second device region A2, a stack structure of the plurality of sacrificial semiconductor layers 104 and the plurality of nanosheet semiconductor layers NS may remain on the top surface of each of the plurality of first fin-type active regions FA and the plurality of second fin-type active regions FB.

The plurality of sacrificial semiconductor layers 104 and the plurality of nanosheet semiconductor layers NS may include semiconductor materials having different etch selectivities. In some example embodiments, the plurality of nanosheet semiconductor layers NS may include a silicon layer, and the plurality of sacrificial semiconductor layers 104 may include a silicon germanium layer. In some example embodiments, the plurality of sacrificial semiconductor layers 104 may have a constant germanium (Ge) content. A silicon germanium (SiGe) layer included in the plurality of sacrificial semiconductor layers 104 may have a constant Ge content, which is selected in a range of about 5 atomic percent (at %) to about 60 at %, for example, a range of about 10 at % to about 40 at %. A Ge content of the SiGe layer included in the plurality of sacrificial semiconductor layers 104 may be variously selected as needed.

Figure 7A:
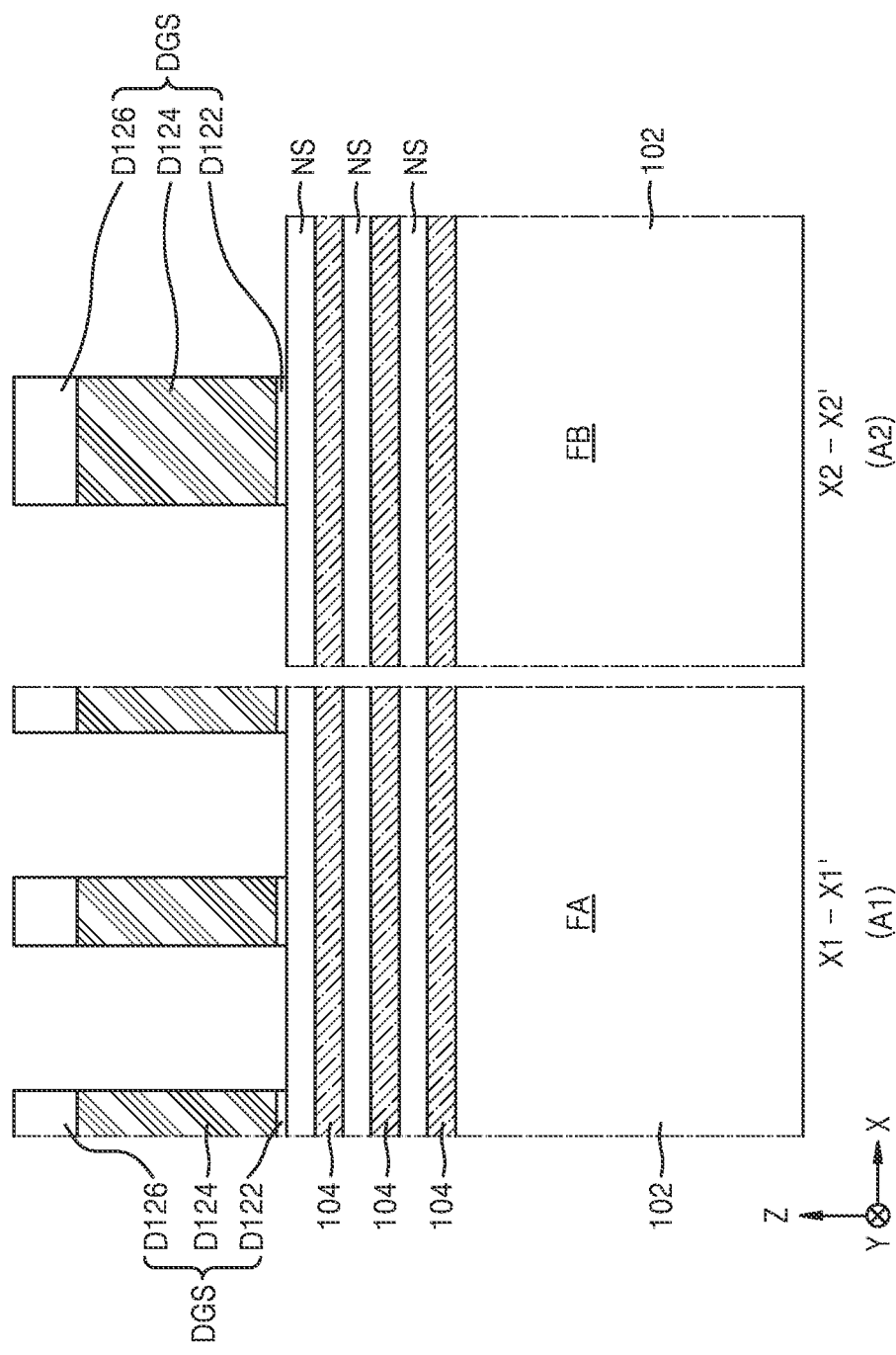
Figure 7B:
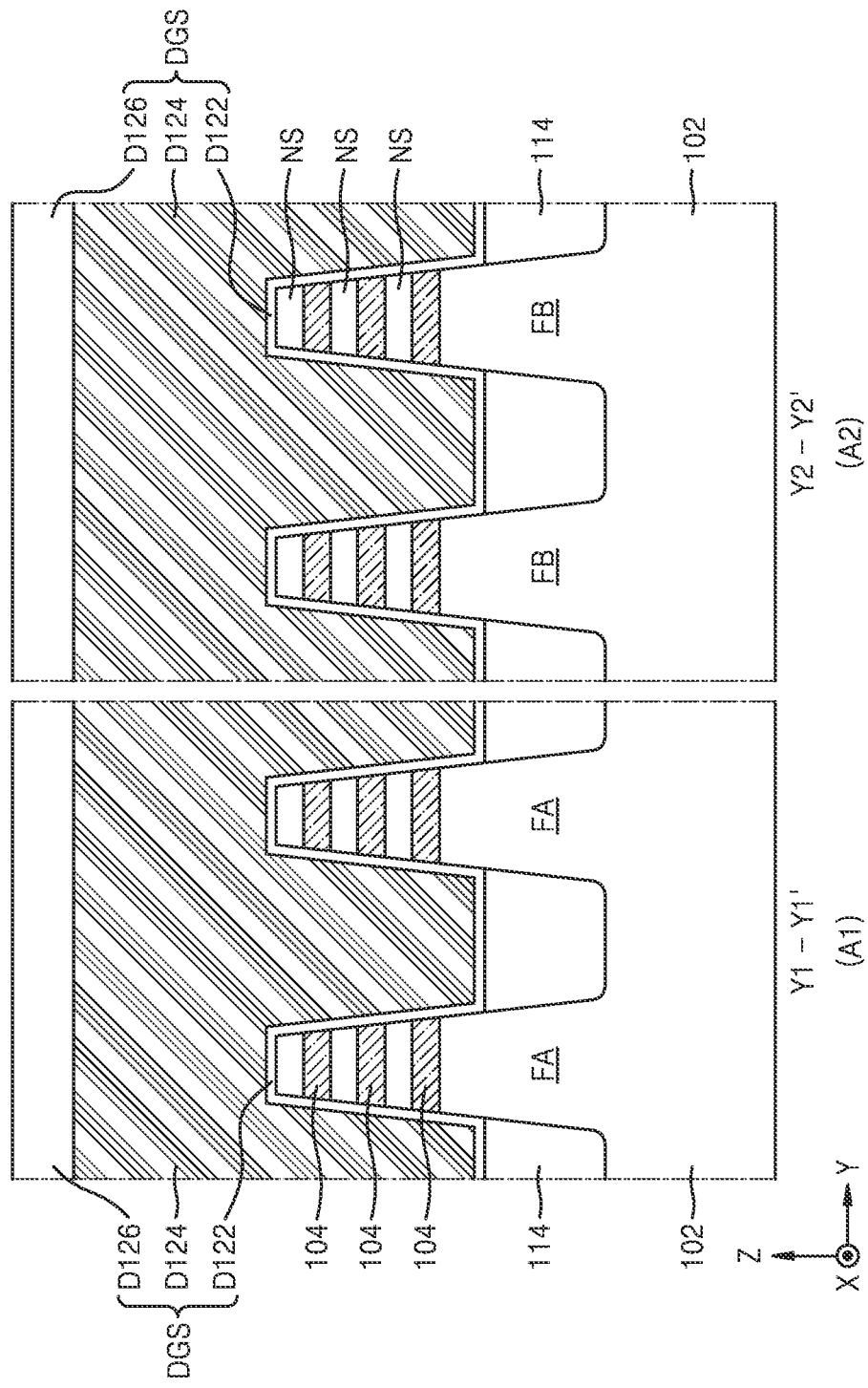

Referring to FIGS. 7A and 7B, a plurality of dummy gate structures DGS may be formed on the stack structures of the plurality of sacrificial semiconductor layers 104 and the plurality of nanosheet semiconductor layers NS in the first device region A1 and the second device region A2.

Each of the plurality of dummy gate structures DGS may extend in length in the second lateral direction (the Y direction). Each of the plurality of dummy gate structures DGS may have a structure in which an oxide film D122, a dummy gate layer D124, and a capping layer D126 are sequentially stacked. In some example embodiments, the dummy gate layer D124 may include polysilicon, and the capping layer D126 may include a silicon nitride film.

Figure 8:
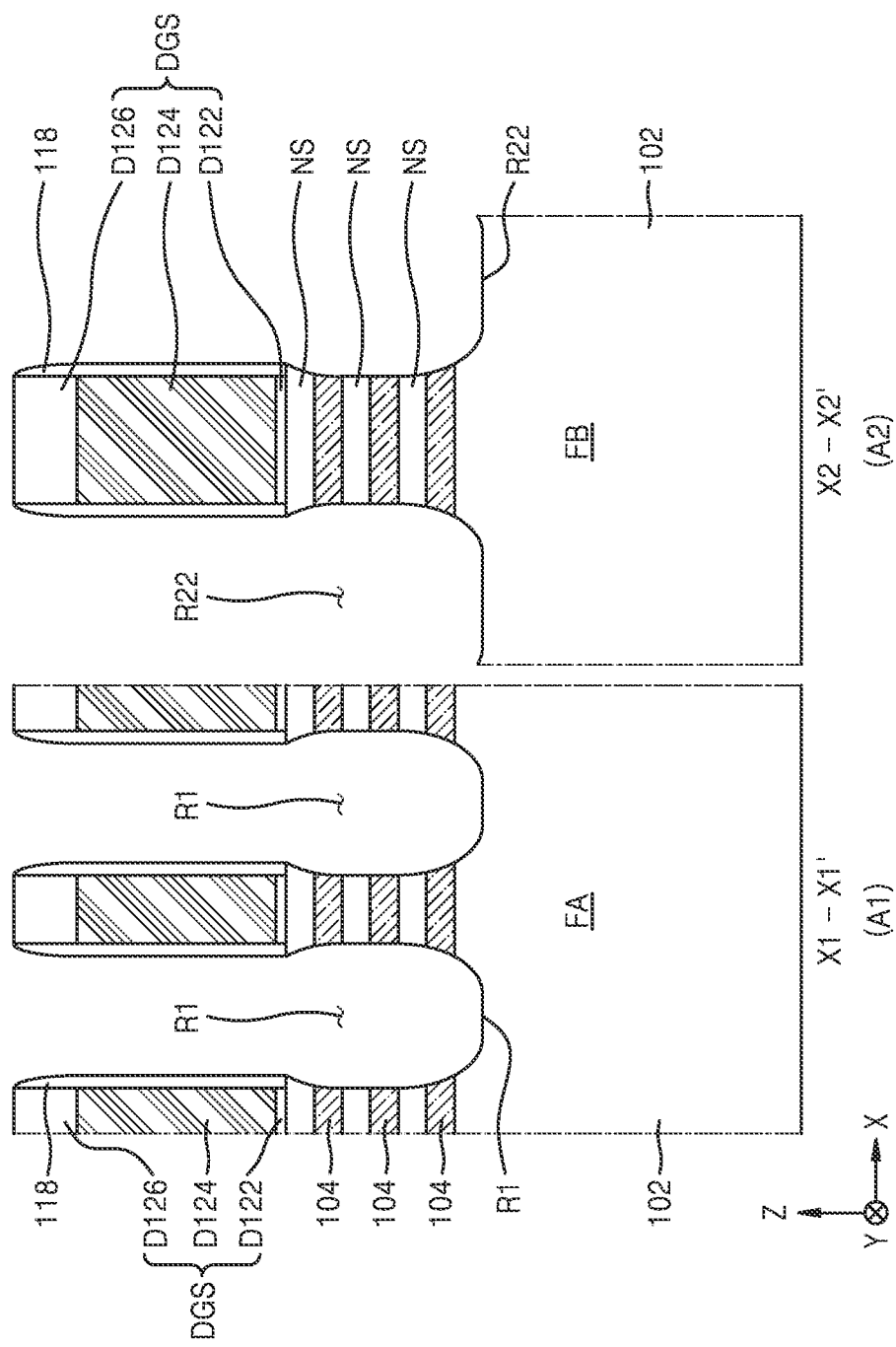

Referring to FIG. 8, a plurality of insulating spacers 118 may be formed in the first device region A1 and the second device region A2 to cover both sidewalls of each of the plurality of dummy gate structures DGS. Thereafter, a portion of each of the plurality of sacrificial semiconductor layers 104 and the plurality of nanosheet semiconductor layers NS may be removed using the plurality of dummy gate structures DGS and the plurality of insulating spacers 118 as etch masks. Next, the first fin-type active region FA and the second fin-type active region FB, which are exposed, may be etched. As a result, a plurality of recesses R1 may be formed in an upper portion of the first fin-type active region FA in the first device region A1, and a plurality of recesses R22 may be formed in an upper portion of the second fin-type active region FB in the second device region A2. The plurality of recesses R1 and R22 may be formed using a dry etching process, a wet etching process, or a combination thereof.

Figure 9:
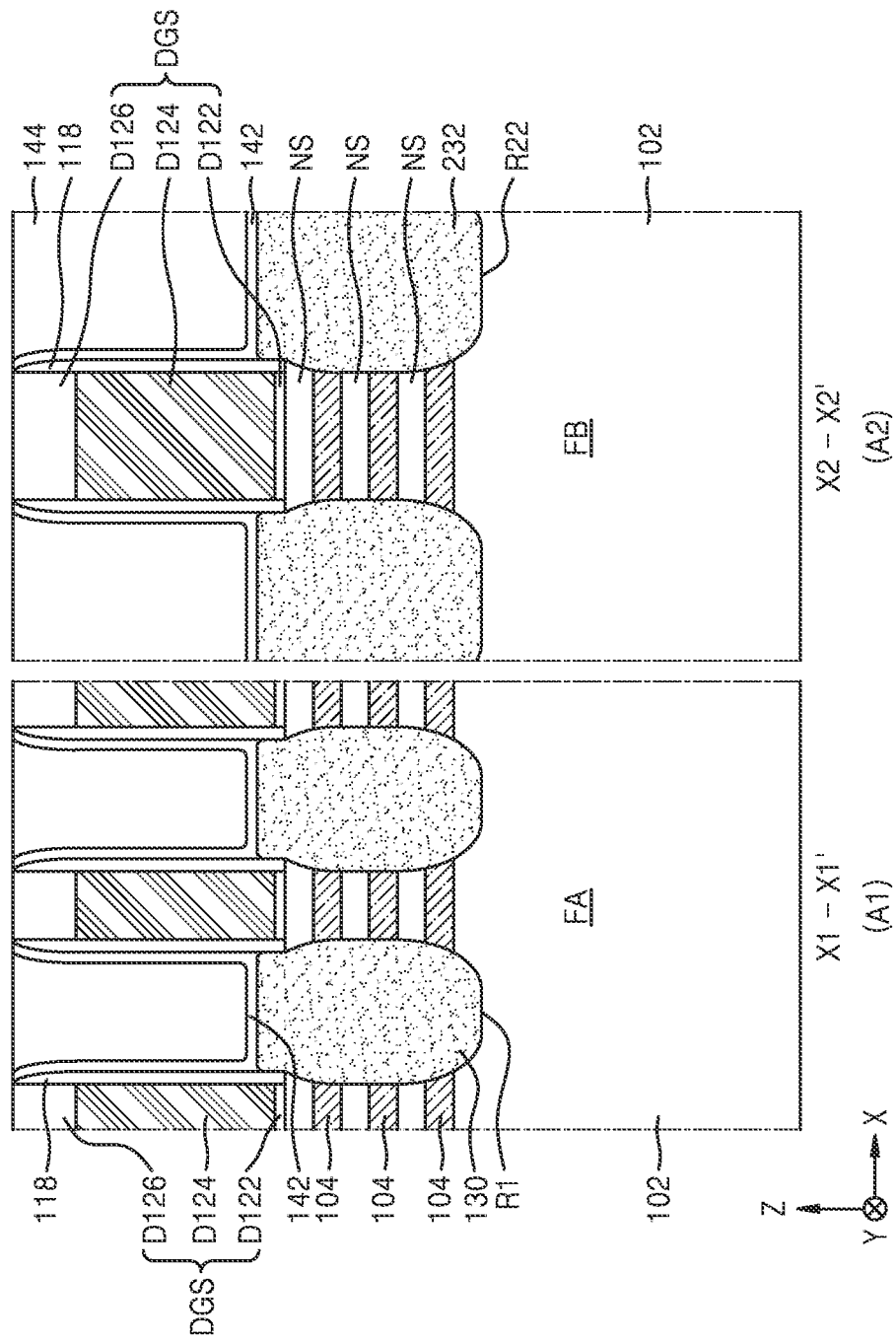

Referring to FIG. 9, a plurality of first source/drain regions 130 may be formed in the first device region A1 to fill the plurality of recesses R1, and a plurality of second source/drain regions 232 may be formed in the second device region A2 to fill the plurality of recesses R22.

To form the plurality of first source/drain regions 130 and the plurality of second source/drain regions 232, a selective epitaxial growth (SEG) process may be performed. In some example embodiments, the plurality of first source/drain regions 130 may be formed simultaneously with the plurality of second source/drain regions 232. In other example embodiments, the plurality of first source/drain regions 130 and the plurality of second source/drain regions 232 may be formed using separate processes.

In some example embodiments, at least portions of the plurality of first source/drain regions 130 and the plurality of second source/drain regions 232 may include a SiGe layer doped with a p-type dopant. To form the SiGe layer doped with the p-type dopant, a silicon source and a germanium source may be used. In some example embodiments, silane (SiH$_4$), disilane (Si$_2$H$_6$), trisilane (Si$_3$H$_8$), and/or dichlorosilane (SiH$_2$Cl$_2$) may be used as the silicon source. In some example embodiments, germane (GeH$_4$), digermane (Ge$_2$H$_6$), trigermane (Ge$_3$H$_8$), tetragermane (Ge$_4$H$_{10}$), and/or dichlorogermane (Ge$_2$H$_2$C$_{12}$) may be used as the Ge source. The p-type dopant may be selected from boron and gallium.

In some example embodiments, at least portions of the plurality of first source/drain regions 130 and the plurality of second source/drain regions 232 may include a silicon layer doped with an n-type dopant. To form the silicon layer doped with the n-type dopant, at least one of the silicon sources described above may be used. As an example, the n-type dopant may be selected from phosphorus (P), arsenic (As), and antimony (Sb).

Thereafter, an insulating liner 142 may be formed in the first device region A1 and the second device region A2 to cover the resultant structure that includes the plurality of first source/drain regions 130 and the plurality of second source/drain regions 232. An inter-gate dielectric film 144 may be formed on the insulating liner 142. Thereafter, the insulating liner 142 and the inter-gate dielectric film 144 may be planarized to expose a top surface of the capping layer D126.

Figure 10:
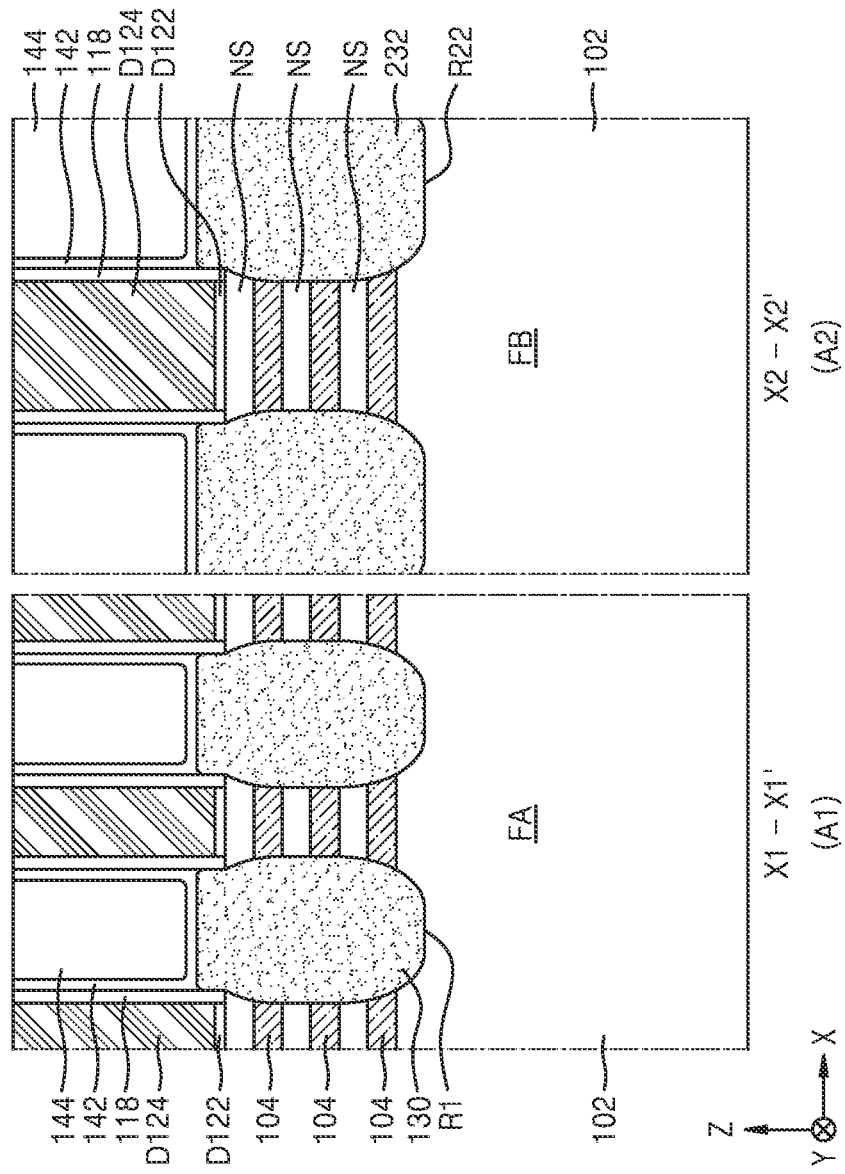

Referring to FIG. 10, the capping layer D126 may be removed from the resultant structure of FIG. 9 to expose a top surface of the dummy gate layer D124, and the insulating liner 142 and the inter-gate dielectric film 144 may be partially removed such that a top surface of the inter-gate dielectric film 144 may substantially be at the same level as the top surface of the dummy gate layer D124.

Figure 11:
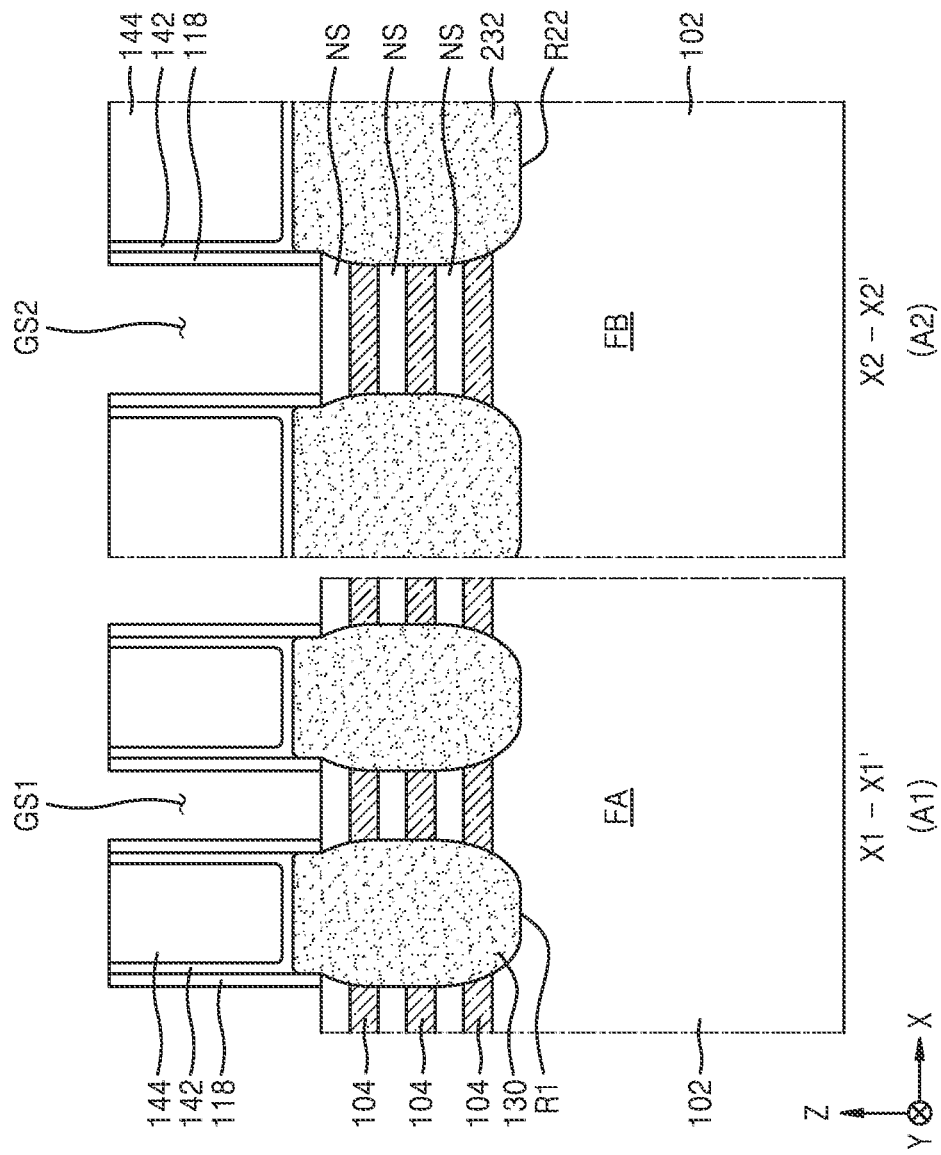

Referring to FIG. 11, the dummy gate layer D124 and the oxide film D122 located thereunder may be removed from the resultant structure of FIG. 10. As a result, a first gate space GS1 may be formed in the first device region A1, and a second gate space GS2 may be formed in the second device region A2. The nanosheet semiconductor layer NS may be exposed through the first gate space GS1 and the second gate space GS2.

Figure 12A:
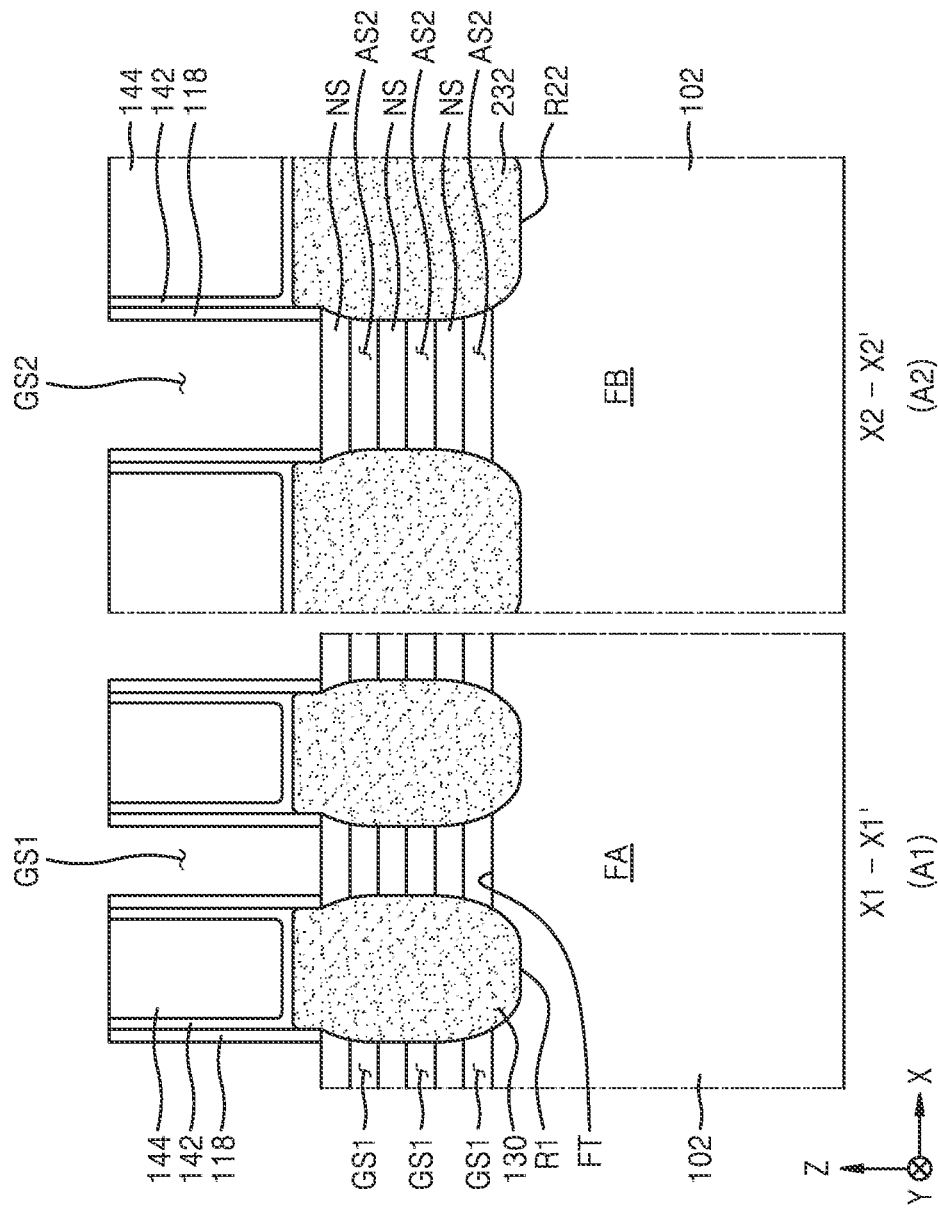
Figure 12B:
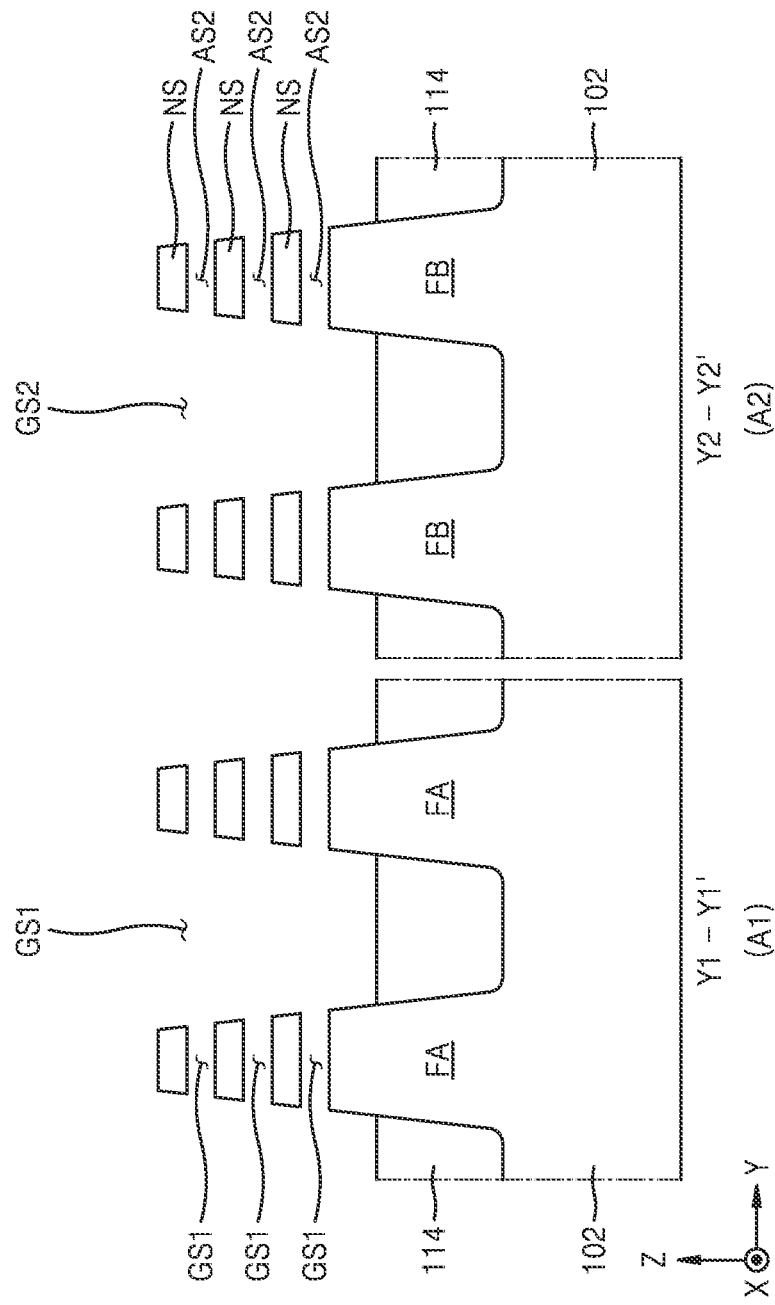

Referring to FIGS. 12A and 12B, the plurality of sacrificial semiconductor layers 104, which remain in the resultant structure of FIG. 11, may be removed through the first gate space GS1 and the second gate space GS2 in the first device region A1 and the second device region A2.

As a result, in the first device region A1, the first gate space GS1 may extend to respective spaces among or between the plurality of nanosheet semiconductor layers NS, and in a space between the lowermost nanosheet semiconductor layer NS, and a fin top surface FT of the first fin-type active region FA. In the second device region A2, a plurality of active spaces AS2 may be provided in portions from which the plurality of sacrificial semiconductor layers 104 are removed, under the second gate space GS2. The plurality of active spaces AS2 may surround the plurality of nanosheet semiconductor layers NS, respectively. In a first lateral direction (e.g., the X direction), both ends of each of the plurality of active spaces AS2 may have structures blocked by a pair of second source/drain regions 232. In the second lateral direction (the Y direction), both ends of each of the plurality of active spaces AS2 may have open structures to be connected to the second gate space GS2. As shown in FIG. 12B, a length of the plurality of active spaces AS2 in the second lateral direction (the Y direction) may be gradually reduced in a direction away from the substrate 102 in the vertical direction (the Z direction).

Figure 13A:
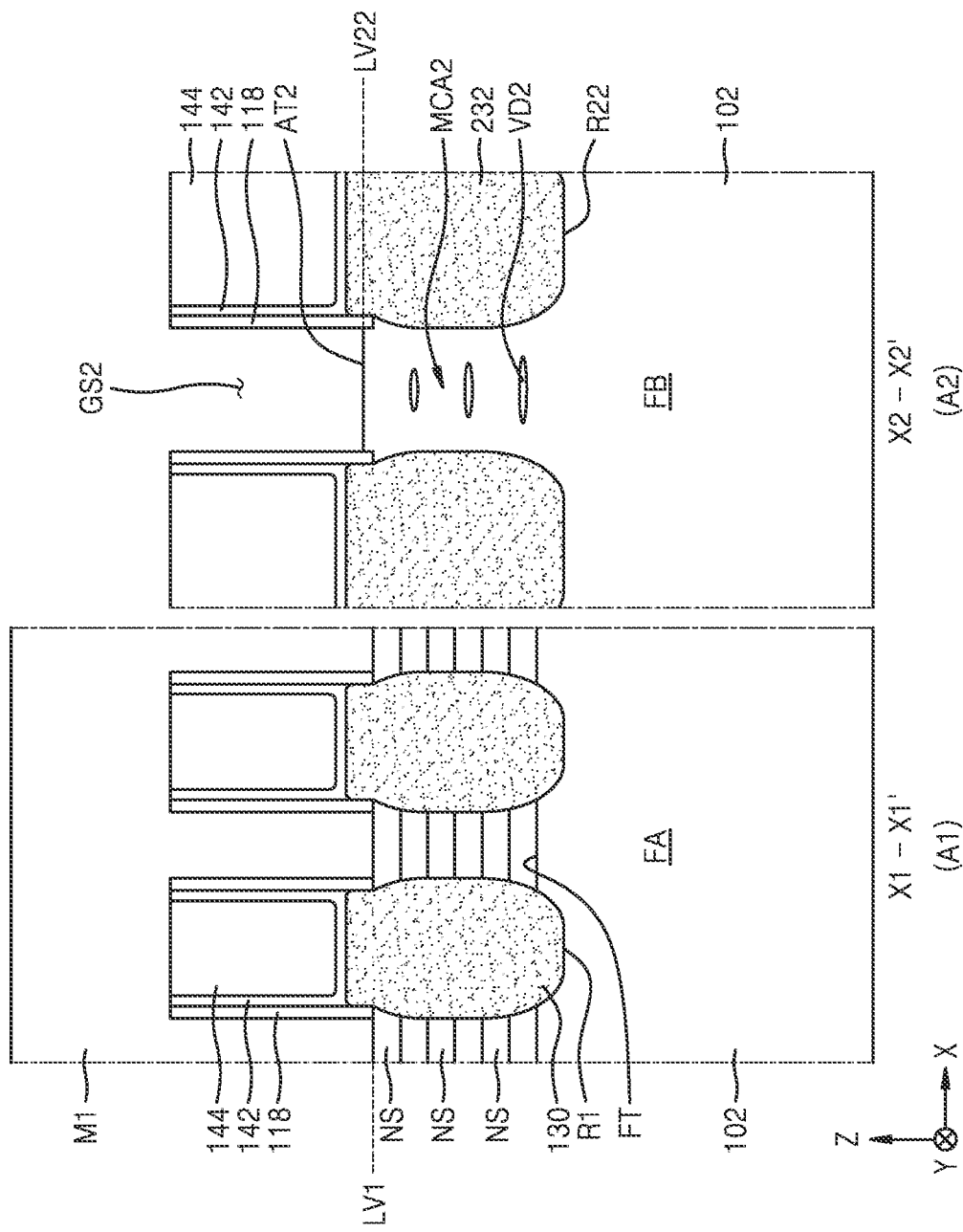

Referring to FIGS. 13A and 13B, a protective mask pattern M1 may be formed to expose the second device region A2 and cover the first device region A1 in the resultant structure of FIGS. 12A and 12B. In the second device region A2, a semiconductor material layer may be epitaxially grown on exposed surfaces of the plurality of nanosheet semiconductor layers NS and exposed surfaces of the second fin-type active region FB, and thus, a plurality of mesa-type channel regions MCA2 may be formed.

The protective mask pattern M1 may include a material capable of selectively removing a constituent material of each of components exposed in the first device region A1, from the resultant structure of FIGS. 12A and 12B. For example, the protective mask pattern M1 may include a spin-on hardmask (SOH) film or a photoresist film, without being limited thereto. The SOH film may include a carbon-containing organic compound having a relatively high carbon content of about 85% to about 99% by weight, based on a total weight thereof. The carbon-containing organic compound may include a hydrocarbon compound including an aromatic ring, such as phenyl, benzene, or naphthalene, or derivatives thereof.

To form the plurality of mesa-type channel regions MCA2 in the second device region A2, while the semiconductor material layer is being epitaxially grown on the exposed surfaces of the plurality of nanosheet semiconductor layers NS and the exposed surfaces of the second fin-type active region FB, source gases required to form the semiconductor material layer may be supplied through the second gate space GS2 to the plurality of active spaces AS2. In the second device region A2, the semiconductor material layer may be epitaxially grown from a top surface and a bottom surface of each of the plurality of nanosheet semiconductor layers NS and both sidewalls of each of the plurality of nanosheet semiconductor layers NS in the second lateral direction (the Y direction). Thus, before the inside of each of the plurality of active spaces AS2 is completely filled with the semiconductor material layer, both ends of each of the plurality of active spaces AS2 in the second lateral direction (the Y direction) may be blocked with the epitaxially grown semiconductor material layer. As a result, the plurality of mesa-type channel regions MCA2 having the plurality of round convex portions RC2 may be obtained, and the plurality of voids VD2 may respectively remain inside the plurality of mesa-type channel regions MCA2. In the plurality of mesa-type channel regions MCA2, the plurality of voids VD2 may remain filled with process gases required for epitaxial growth of the semiconductor material layer or byproducts thereof. As shown in FIG. 12B, when the length of the plurality of active spaces AS2 in the second lateral direction (the Y direction) is gradually reduced in the direction away from the substrate 102), the processes described with reference to FIGS. 13A and 13B may be performed. Thus, a size of the plurality of voids VD2, which may remain inside the plurality of mesa-type channel regions MCA2 after the plurality of mesa-type channel regions MCA2 are formed, may be gradually reduced in a vertical direction away from the substrate 102. In other words, a void VD2 farther from a top surface of the substrate 102 may be smaller than a void VD2 that is nearer to the top surface of the substrate 102.

After the plurality of mesa-type channel regions MCA2 are formed, a second vertical level VL22 of an uppermost surface AT2 of the plurality of mesa-type channel regions MCA2 may be higher than a first vertical level VL1 of an uppermost surface of the third nanosheet N3, which is an uppermost one of the first to third nanosheets N1, N2, and N3 in the first device region A1.

Figure 14A:
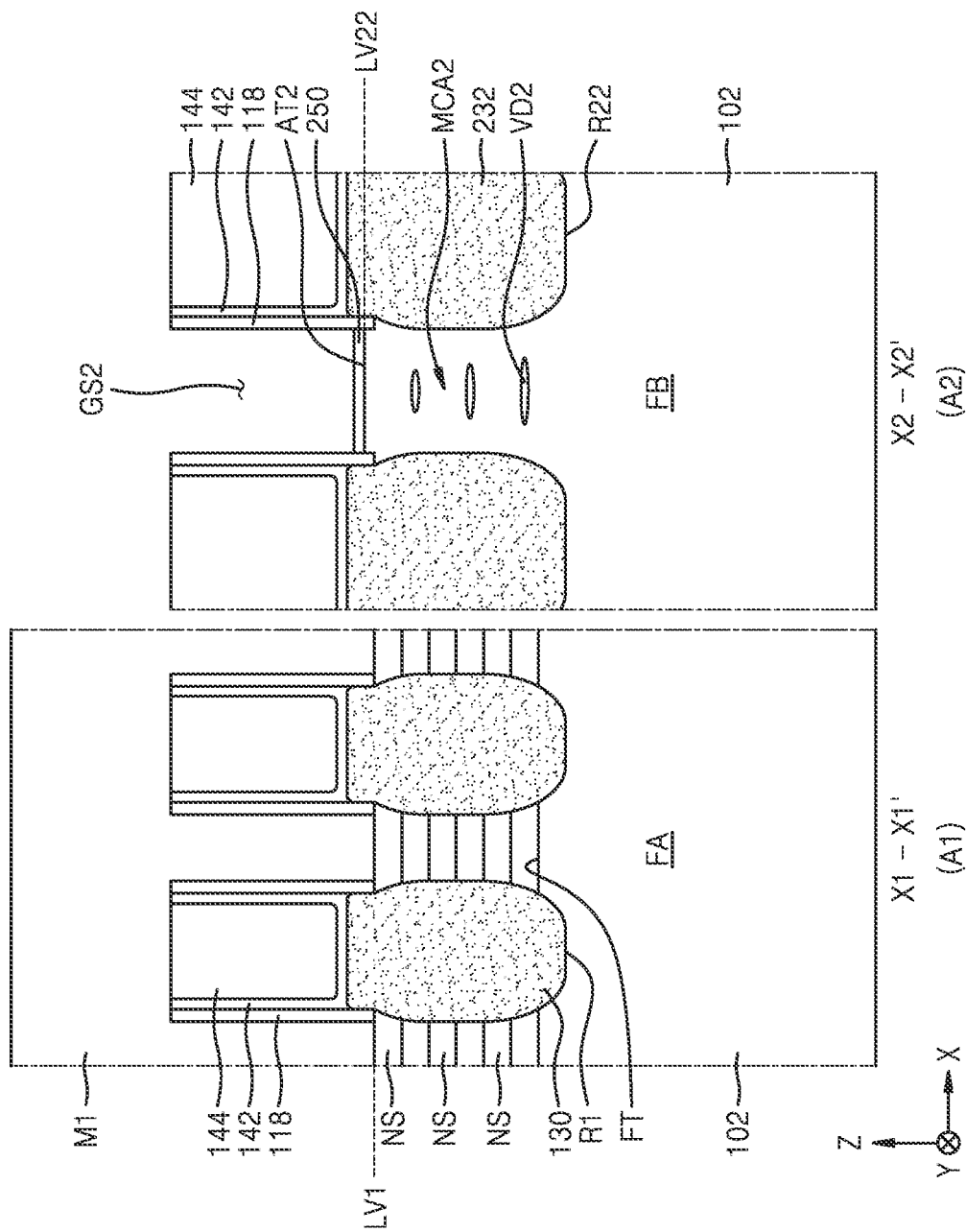

Referring to FIGS. 14A and 14B, a gate dielectric film 250 may be formed to cover outer surfaces of the plurality of mesa-type channel regions MCA2, which are exposed in the second device region A2 of the resultant structure of FIGS. 13A and 13B.

Figure 15A:
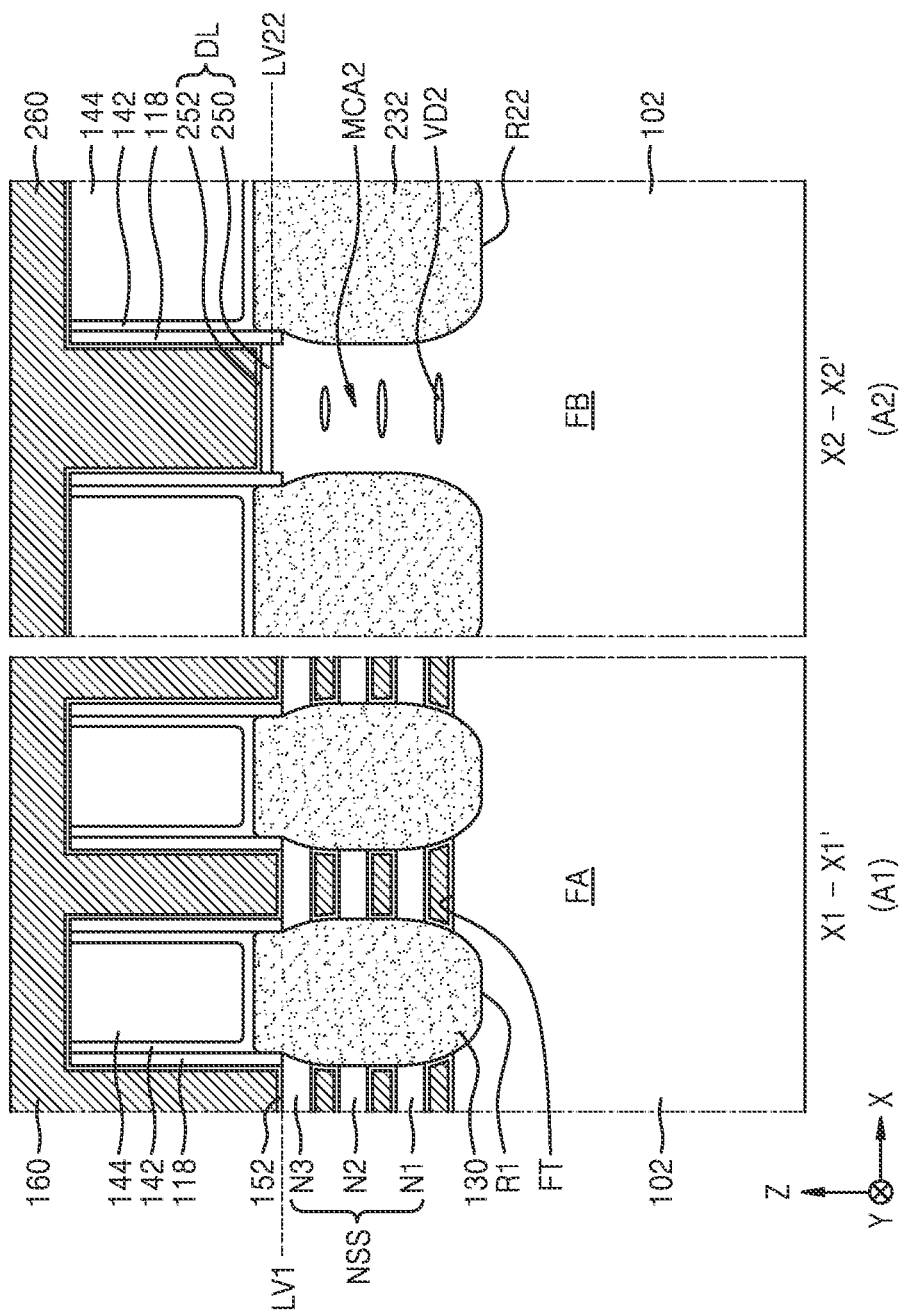
Figure 15B:
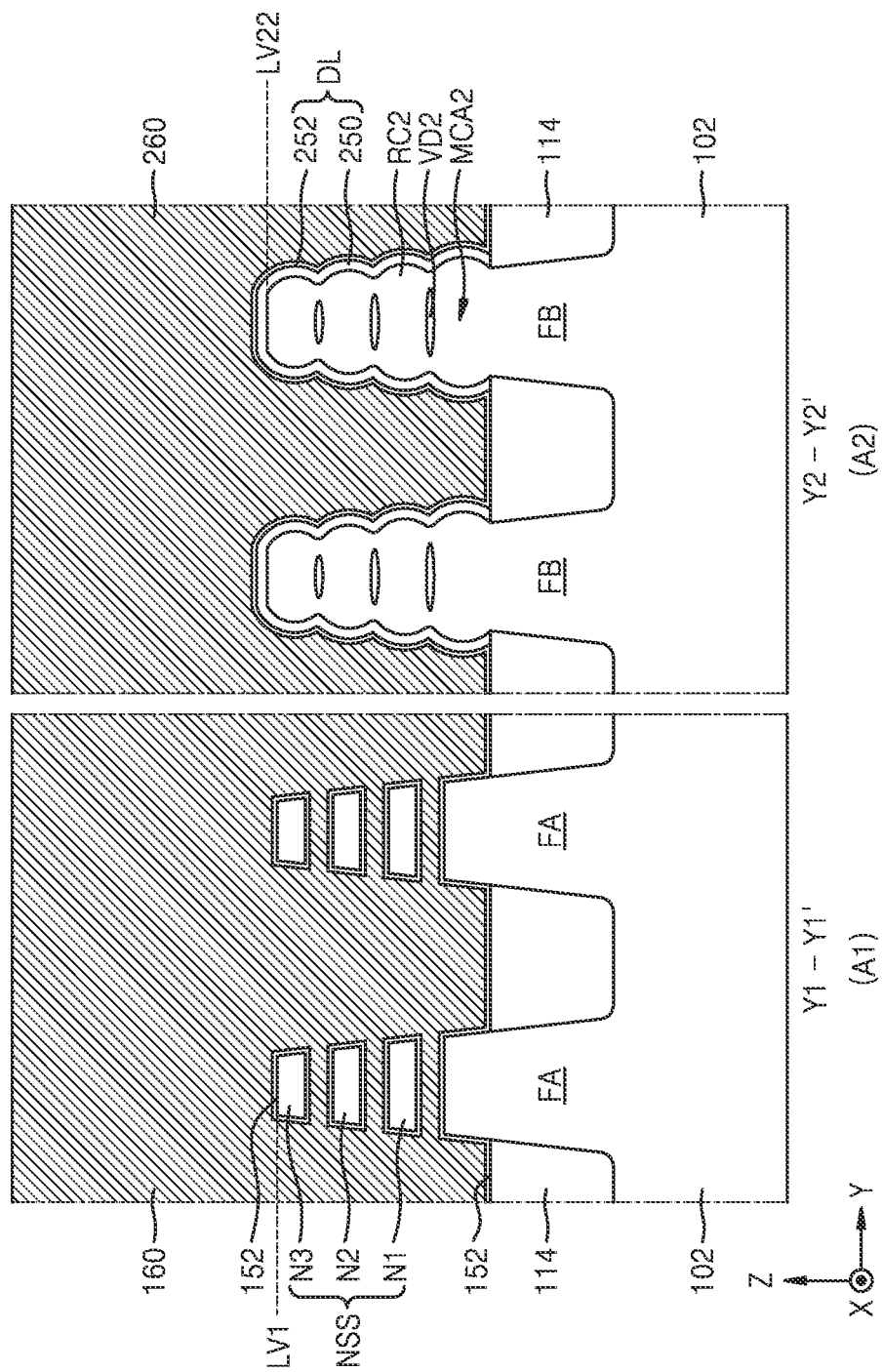

Referring to FIGS. 15A and 15B, the protective mask pattern M1 may be removed from the resultant structure of FIGS. 14A and 14B. After the protective mask pattern M1 is removed, the plurality of nanosheet semiconductor layers NS, which remain in the first device region A1, may be left as a plurality of nanosheet stacks NSS including the first to third nanosheets N1, N2, and N3.

Thereafter, a first gate dielectric film 152 may be formed to cover and conform to exposed surfaces in the first device region A1, and an upper gate dielectric film 252 may be formed to cover and conform to exposed surfaces in the second device region A2. The first gate dielectric film 152 and the upper gate dielectric film 252 may be formed to have a relatively uniform thickness. Afterwards, a first conductive film 160 may be formed in the first device region A1 to cover the first gate dielectric film 152, and a second conductive film 260 may be formed in the second device region A2 to cover the upper gate dielectric film 252. In the first device region A1, the first conductive film 160 may be formed on the first gate dielectric film 152 to fill the first gate space GS1 (refer to FIGS. 12A and 12B) and cover the top surface of the inter-gate dielectric film 144. In the second device region A2, the second conductive film 260 may be formed on the upper gate dielectric film 252 to fill the second gate space GS2 (refer to FIG. 14B) and cover the top surface of the inter-gate dielectric film 144.

In some example embodiments, the first gate dielectric film 152 may be formed simultaneously with the upper gate dielectric film 252. In other example embodiments, the first gate dielectric film 152 and the upper gate dielectric film 252 may be formed using separate processes.

In some example embodiments, the first conductive film 160 may be formed simultaneously with the second conductive film 260. In other example embodiments, the first conductive film 160 and the second conductive film 260 may be formed using separate processes. Constituent materials of the first conductive film 160 and the second conductive film 260 may be respectively the same as those of the first gate line GL1 and the second gate line GL2, which have been described with reference to FIGS. 2A to 2D.

Figure 16A:
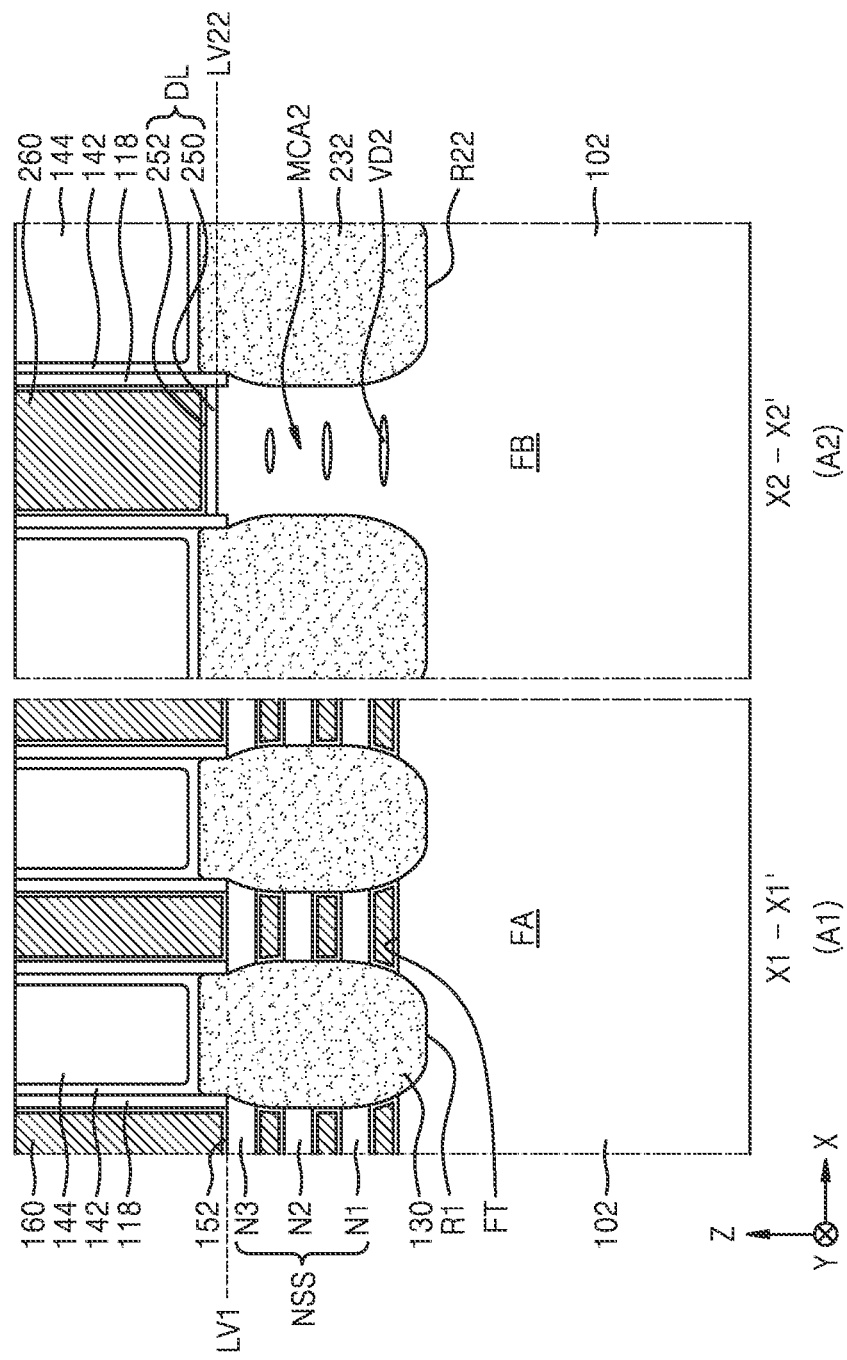
Figure 16B:
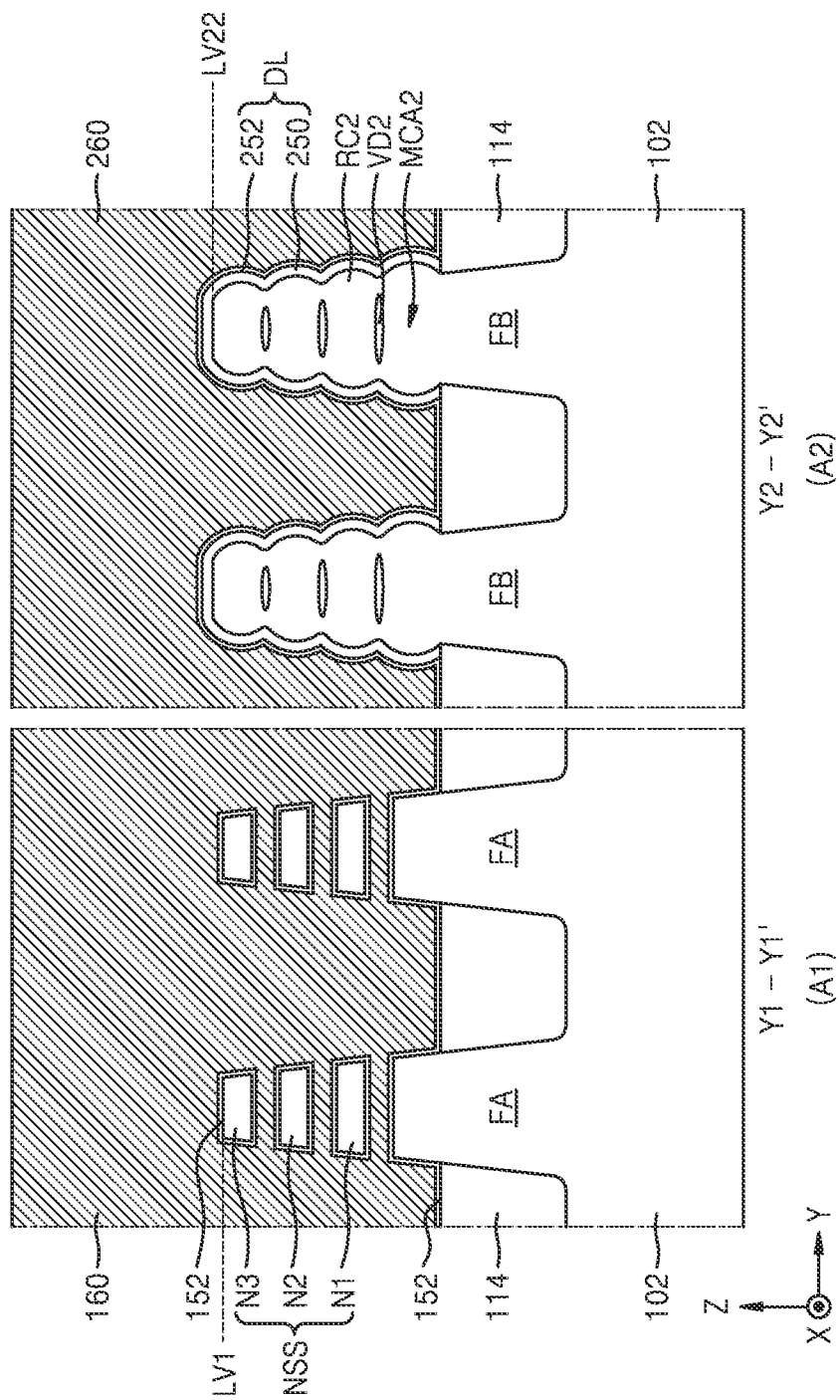

Referring to FIGS. 16A and 16B, in the resultant structure of FIGS. 15A and 15B, a portion of each of the first conductive film 160, the second conductive film 260, the first gate dielectric film 152, and the upper gate dielectric film 252 may be removed to expose the top surface of the inter-gate dielectric film 144 in the first device region A1 and the second device region A2.

Thereafter, a portion of each of the first conductive film 160, the second conductive film 260, the first gate dielectric film 152, the upper gate dielectric film 252, and the insulating spacer 118 may be further removed such that an upper portion of the first gate space GS1 (refer to FIGS. 12A and 12B) in the first device region A1 and an upper portion of the second gate space GS2 (refer to FIG. 14B) in the second device region A2 are emptied again. Thus, a plurality of first gate lines GL1 and a plurality of second gate lines GL22, which are shown in FIGS. 4, 5A, and 5B, may be formed. Also, a first capping insulating pattern 164 (refer to FIGS. 2A and 2B) and a second capping insulating pattern 266 (refer to FIGS. 5A and 5B) may be formed to cover the plurality of first gate lines GL1 and the plurality of second gate lines GL22 in a plurality of first gate spaces GS1 (refer to FIGS. 12A and 12B) and a plurality of second gate spaces GS2 (refer to FIG. 14B).

Although the method of manufacturing the IC device 200 shown in FIGS. 4, 5A, and 5B, according to some example embodiments, has been described above with reference to FIGS. 6A to 16B, it will be understood that the IC devices 100, 100A, 100B, and 100C and IC devices having various other structures may be manufactured by making various modifications and changes within the scope of the inventive concept with reference to the above description of FIGS. 6A to 16B.

While the inventive concepts have been particularly shown and described with reference to some examples of embodiments thereof, it will be understood that various changes in form and details may be made therein without departing from the scope of the following claims.

What is claimed is:

1. An integrated circuit device comprising:
a fin-type active region on a substrate;
a mesa-type channel region protruding from the fin-type active region in a vertical direction, the mesa-type channel region integrally connected with the fin-type active region;
a gate line that substantially surrounds the mesa-type channel region on the fin-type active region; and
a gate dielectric film between the mesa-type channel region and the gate line,
wherein the mesa-type channel region comprises: a plurality of round convex portions, which are convex toward the gate line; a concavo-convex sidewall, which comprises a portion of each of the plurality of round convex portions and faces the gate line; and at least one void, which is inside the mesa-type channel region.

2. The integrated circuit device of claim 1, wherein the at least one void comprises a plurality of voids colinear in the vertical direction inside the mesa-type channel region, and
the plurality of voids have smaller sizes in a direction away from the substrate.

3. The integrated circuit device of claim 1, wherein the fin-type active region extends in length in a first lateral direction,
wherein the gate line extends in length in a second lateral direction, which intersects with the first lateral direction, and
wherein a greatest width of the mesa-type channel region is greater than a smallest width of the fin-type active region in the second lateral direction.

4. The integrated circuit device of claim 1, further comprising a pair of source/drain regions on respective sides of the gate line on the fin-type active region,
wherein the mesa-type channel region has surfaces in contact with the pair of source/drain regions.

5. The integrated circuit device of claim 1, wherein the plurality of round convex portions are colinear in the vertical direction, and
wherein a greatest width of each of the plurality of round convex portions in a lengthwise direction of the gate line is reduced in size with increasing distance from the substrate.

6. The integrated circuit device of claim 1, wherein the at least one void is filled with a gas comprising silicon atoms.

7. The integrated circuit device of claim 1, wherein the gate dielectric film comprises a concavo-convex portion that faces the plurality of round convex portions.

8. The integrated circuit device of claim 1, wherein the gate line comprises a concavo-convex portion that faces the plurality of round convex portions.

9. The integrated circuit device of claim 1, further comprising an insulating spacer that covers a sidewall of the gate line on the mesa-type channel region,
wherein the mesa-type channel region comprises a first top surface unit that faces the gate line and a second top surface unit facing the insulating spacer, and
wherein a first vertical level of the first top surface unit is farther from the substrate than a second vertical level of the second top surface unit is from the substrate.

10. The integrated circuit device of claim 1, further comprising a pair of source/drain regions on respective sides of the gate line on the fin-type active region,
wherein the at least one void comprises a plurality of voids colinear in the vertical direction inside the mesa-type channel region, and
wherein lowermost surfaces of the pair of source/drain regions are closer to the substrate than a lowermost one of the plurality of voids is to the substrate.

11. An integrated circuit device comprising:
a substrate comprising a first device region and a second device region, which are spaced apart from each other in a lateral direction;
a first fin-type active region in the first device region;
a nanosheet stack on the first fin-type active region in the first device region, the nanosheet stack comprising at least one nanosheet;
a first gate line on the first fin-type active region in the first device region, the first gate line surrounding the at least one nanosheet;
a second fin-type active region in the second device region;
a mesa-type channel region protruding from the second fin-type active region in a vertical direction in the second device region, the mesa-type channel region integrally connected with the second fin-type active region; and
a second gate line on the second fin-type active region in the second device region, the second gate line surrounding substantially the mesa-type channel region,
wherein the mesa-type channel region comprises: a plurality of round convex portions, which are convex toward the second gate line; a concavo-convex sidewall, which comprises a portion of each of the plurality of round convex portions and faces the second gate line; and at least one void, which is inside the mesa-type channel region.

12. The integrated circuit device of claim 11, wherein the at least one nanosheet has a first uppermost surface that is a farthest nanosheet surface from the substrate, wherein the mesa-type channel region has a second uppermost surface that is a farthest mesa-type channel region surface from the substrate, and wherein the second uppermost surface is farther from the substrate than the first uppermost surface.

13. The integrated circuit device of claim 11, wherein the first gate line comprises a main gate portion that covers the nanosheet stack, wherein the first gate line comprises at least one sub-gate portion that covers the at least one nanosheet between the substrate and the main gate portion, the at least one sub-gate portion integrally connected to the main gate portion, and
wherein the at least one sub-gate portion and the at least one void are equidistant from the substrate.

14. The integrated circuit device of claim 11, further comprising:
a pair of first source/drain regions on respective sides of the first gate line in a first widthwise direction in the first device region, the pair of first source/drain regions in contact with both sidewalls of the nanosheet stack; and
a pair of second source/drain regions on respective sides of the second gate line in a second widthwise direction in the second device region, the pair of second source/drain regions in contact with both sidewalls of the mesa-type channel region,
wherein the first gate line has a first width in the first widthwise direction, the second gate line has a second width in the second widthwise direction, and the second width is greater than the first width.

15. The integrated circuit device of claim 11, wherein the at least one void comprises a plurality of voids colinear in the vertical direction inside the mesa-type channel region, and
wherein the plurality of voids decrease in size with increasing distance from the substrate.

16. The integrated circuit device of claim 11, wherein the plurality of round convex portions are colinear in the vertical direction, and
wherein a maximum width of each of the plurality of round convex portions in a lengthwise direction of the second gate line is reduced with increasing distance from the substrate.

17. The integrated circuit device of claim 11, wherein the at least one void is filled with gas comprising silicon atoms.

18. The integrated circuit device of claim 11, further comprising an insulating spacer that covers a sidewall of the second gate line on the mesa-type channel region in the second device region,
wherein the mesa-type channel region comprises a first top surface unit that faces the second gate line and a second top surface unit that faces the insulating spacer, and
wherein a first vertical level of the first top surface unit is farther from the substrate than a second vertical level of the second top surface unit is from the substrate.

19. An integrated circuit device comprising:
a substrate comprising a first device region and a second device region, which are spaced apart from each other;
a first fin-type active region in the first device region;
a plurality of nanosheets on the first fin-type active region in the first device region;
a first gate line on the first fin-type active region in the first device region, the first gate line surrounding the plurality of nanosheets;
a second fin-type active region in the second device region;
a mesa-type channel region protruding from the second fin-type active region in a vertical direction in the second device region, the mesa-type channel region integrally connected with the second fin-type active region; and
a second gate line on the second fin-type active region in the second device region, the second gate line surrounding substantially the mesa-type channel region,
wherein the mesa-type channel region comprises: a plurality of round convex portions, which are convex toward the second gate line; a concavo-convex sidewall, which comprises a portion of each of the plurality of round convex portions and faces toward the second gate line; and a plurality of voids, which are colinear in the vertical direction inside the mesa-type channel region, and wherein the plurality of voids have decreasing sizes with increasing distance thereof from the substrate.

20. The integrated circuit device of claim 19, wherein the first gate line comprises a main gate portion that covers the plurality of nanosheets, and wherein the first gate line comprises a plurality of sub-gate portions integrally connected to the main gate portion, the plurality of sub-gate portions between the substrate and the main gate portion and between adjacent ones of the plurality of nanosheets, and
wherein respective ones of the plurality of sub-gate portions and the plurality of voids are equidistant from the substrate.

* * * * *